(12) United States Patent
Lee et al.

(10) Patent No.: US 12,009,391 B2
(45) Date of Patent: Jun. 11, 2024

(54) NANOSHEET FIELD-EFFECT TRANSISTOR DEVICE AND METHOD OF FORMING

(71) Applicant: Taiwan Semiconductor Manufacturing Co., Ltd., Hsinchu (TW)

(72) Inventors: Hsin-Yi Lee, Hsinchu (TW); Weng Chang, Hsinchu (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 328 days.

(21) Appl. No.: 17/341,034

(22) Filed: Jun. 7, 2021

(65) Prior Publication Data

US 2022/0336584 A1    Oct. 20, 2022

Related U.S. Application Data

(60) Provisional application No. 63/174,634, filed on Apr. 14, 2021.

(51) Int. Cl.
| | | |
|---|---|---|
| *H01L 27/092* | (2006.01) | |
| *H01L 21/8234* | (2006.01) | |
| *H01L 29/06* | (2006.01) | |
| *H01L 29/66* | (2006.01) | |
| *H01L 29/78* | (2006.01) | |

(52) U.S. Cl.
CPC .. *H01L 29/0673* (2013.01); *H01L 21/823418* (2013.01); *H01L 21/823431* (2013.01); *H01L 27/0924* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| | | |
|---|---|---|
| 9,209,247 B2 | 12/2015 | Colinge et al. |
| 9,224,833 B2 | 12/2015 | Chen et al. |
| 9,251,888 B1 | 2/2016 | Liaw |
| 9,583,486 B1 | 2/2017 | Ando et al. |
| 10,937,787 B2 | 3/2021 | Noh et al. |
| 11,177,259 B2 | 11/2021 | Cheng et al. |

(Continued)

FOREIGN PATENT DOCUMENTS

| | | | |
|---|---|---|---|
| EP | 3588575 A1 | 1/2020 | |
| KR | 20190140564 A | 12/2019 | |

(Continued)

*Primary Examiner* — Joseph C. Nicely
*Assistant Examiner* — Lamont B Koo
(74) *Attorney, Agent, or Firm* — Slater Matsil, LLP

(57) ABSTRACT

A semiconductor device includes: a fin protruding above a substrate; source/drain regions over the fin; nanosheets between the source/drain regions; and a gate structure over the fin and between the source/drain regions, the gate structure including: a gate dielectric material around each of the nanosheets; a work function material around the gate dielectric material; a liner material around the work function material, where the liner material has a non-uniform thickness and is thicker at a first location between the nanosheets than at a second location along sidewalls of the nanosheets; and a gate electrode material around at least portions of the liner material.

20 Claims, 17 Drawing Sheets

(56) References Cited

U.S. PATENT DOCUMENTS

| | | |
|---|---|---|
| 11,183,574 B2 | 11/2021 | Cheng et al. |
| 11,282,939 B2 | 3/2022 | Lee et al. |
| 11,355,363 B2 | 6/2022 | Liaw |
| 11,404,578 B2 | 8/2022 | Beattie et al. |
| 2015/0048442 A1 | 2/2015 | Colinge et al. |
| 2015/0303270 A1 | 10/2015 | Liaw |
| 2019/0378911 A1* | 12/2019 | Lee ................. H01L 29/511 |
| 2020/0251593 A1 | 8/2020 | Miao et al. |
| 2020/0286992 A1 | 9/2020 | Song et al. |
| 2020/0365706 A1 | 11/2020 | Lee et al. |

FOREIGN PATENT DOCUMENTS

| | | |
|---|---|---|
| KR | 20200002277 A | 1/2020 |
| TW | 202044589 A | 12/2020 |
| TW | 202109678 A | 3/2021 |
| TW | 202114221 A | 4/2021 |

* cited by examiner

NANOSHEET FIELD-EFFECT TRANSISTOR DEVICE AND METHOD OF FORMING

PRIORITY CLAIM AND CROSS-REFERENCE

This application claims the benefit of U.S. Provisional Application No. 63/174,634, filed on Apr. 14, 2021 and entitled "NWFM AIO Capping Layer of Nanosheet Structure," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the description herein, unless otherwise specified, the same reference number in different figures refers to the same or similar component formed by a same or similar formation method using a same or similar material(s). In addition, figures with the same reference number but different alphabets (e.g., FIGS. 5A, 5B, and 5C) illustrate different views of the semiconductor device at the same stage of processing.

In accordance with some embodiments, a liner material is formed around the work function material of a nanosheet device. The liner material wraps around the work function material around each nanosheet, and prevents the work function material between adjacent nanosheet from merge together and forming a thicker work function material than the work function material at other locations. Since work functional material having non-uniform thickness may cause variations in the threshold voltage $V_{TH}$ of the device formed, the disclosed method avoids or reduces threshold voltage variation due to non-uniform thickness of the work function material, thereby improving the performance of the device formed. In addition, the liner material prevents or reduces the diffusion of aluminum from the work function material to other layers.

Figure 1:
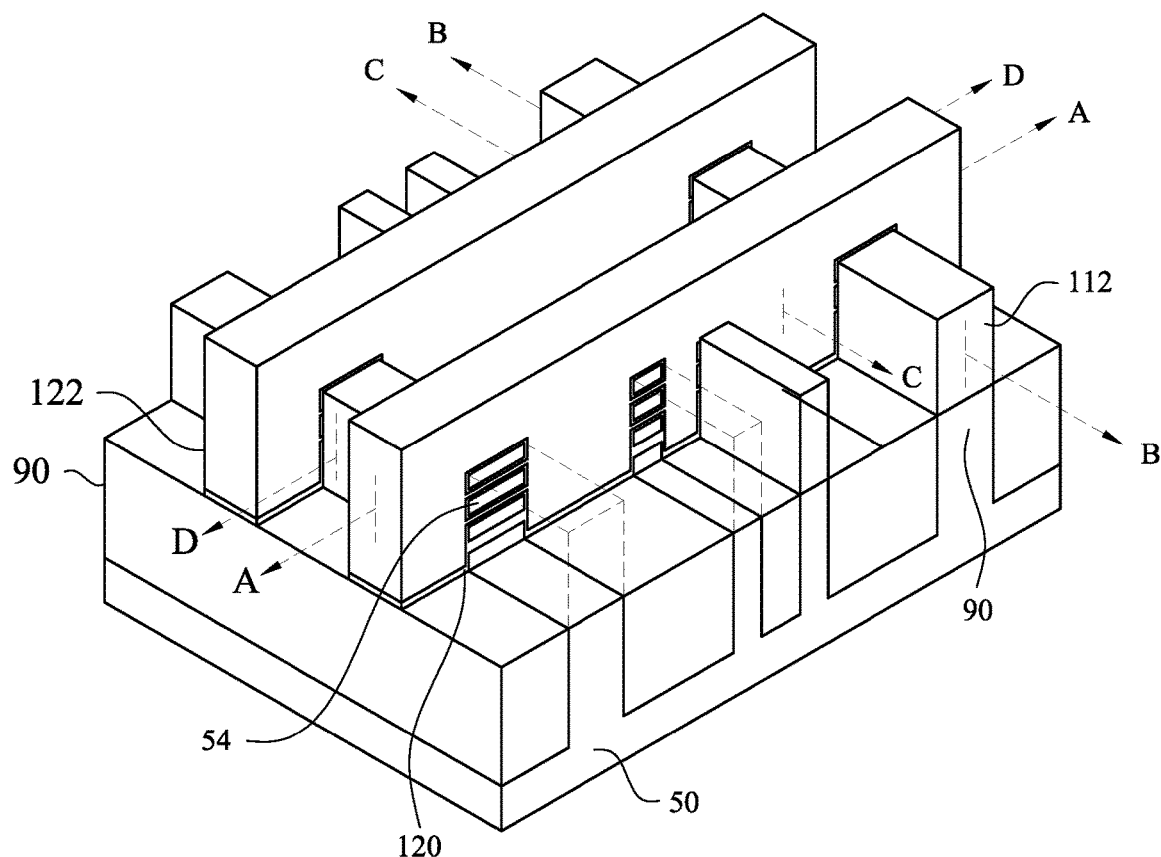
FIG. 1 illustrates an example of a nanosheet field-effect transistor (NSFET) device in a three-dimensional view, in accordance with some embodiments.

FIG. 1 illustrates an example of a nanosheet field-effect transistor (NSFET) device in a three-dimensional view, in accordance with some embodiments. The NSFET device comprises semiconductor fins 90 (also referred to as fins) protruding above a substrate 50. A gate electrode 122 (e.g., a metal gate) is disposed over the fins, and source/drain regions 112 are formed on opposing sides of the gate electrode 122. A plurality of nanosheets 54 are formed over the fins 90 and between source/drain regions 112. Isolation regions 96 are formed on opposing sides of the fins 90. A gate layer stack 120 (which may include, e.g., gate dielectric material, work function material) is formed around the nanosheets 54. Gate electrodes 122 are over and around the gate layer stack 120.

FIG. 1 further illustrates reference cross-sections that are used in later figures. Cross-section A-A is along a longitudinal axis of a gate electrode 122 and in a direction, for example, perpendicular to the direction of current flow between the source/drain regions 112 of an NSFET device. Cross-section B-B is perpendicular to cross-section A-A and is along a longitudinal axis of a fin and in a direction of, for example, a current flow between the source/drain regions 112 of the NSFET device. Cross-section C-C is parallel to cross-section B-B and between two neighboring fins. Cross-section D-D is parallel to cross-section A-A and extends through source/drain regions 112 of the NSFET device. Subsequent figures refer to these reference cross- sections for clarity.

FIGS. 2, 3A, 3B, 4A, 4B, 5A-5C, 6A-6C, 7A-7C, 8A, 8B, 9A, 9B, 10A, 10B, 11-14, 15A, and 15B are cross-sectional views of a nanosheet field-effect transistor (NSFET) device 100 at various stages of manufacturing, in accordance with an embodiment.

Figure 2:
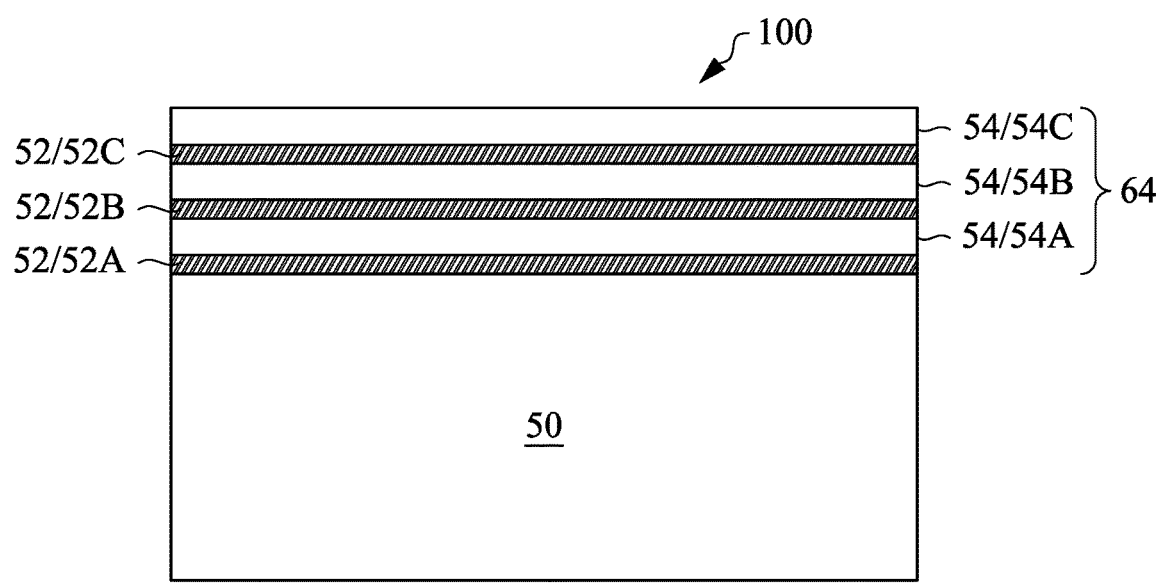
FIGS. 2, 3A, 3B, 4A, 4B, 5A-5C, 6A-6C, 7A-7C, 8A, 8B, 9A, 9B, 10A, 10B, 11-14, 15A, and 15B are cross-sectional views of a nanosheet field-effect transistor device at various stages of manufacturing, in accordance with an embodiment.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

A multi-layer stack 64 is formed on the substrate 50. The multi-layer stack 64 includes alternating layers of a first semiconductor material 52 and a second semiconductor material 54. In FIG. 2, layers formed by the first semiconductor material 52 are labeled as 52A, 52B, and 52C, and layers formed by the second semiconductor material 54 are labeled as 54A, 54B, and 54C. The number of layers formed by the first and the second semiconductor materials illustrated in FIG. 2 are merely non-limiting examples. Other numbers of layers are also possible and are fully intended to be included within the scope of the present disclosure.

In some embodiments, the first semiconductor material 52 is an epitaxial material appropriate for forming channel regions of, e.g., p-type FETs, such as silicon germanium ($Si_xGe_{1-x}$, where x can be in the range of 0 to 1), and the second semiconductor material 54 is an epitaxial material appropriate for forming channel regions of, e.g., n-type FETs, such as silicon. The multi-layer stacks 64 (may also be referred to as an epitaxial material stack) will be patterned to form channel regions of an NSFET in subsequent processing. In particular, the multi-layer stacks 64 will be patterned to form horizontal nanosheets, with the channel regions of the resulting NSFET including multiple horizontal nanosheets.

The multi-layer stacks 64 may be formed by an epitaxial growth process, which may be performed in a growth chamber. In an embodiment, during the epitaxial growth process, the growth chamber is cyclically exposed to a first set of precursors for selectively growing the first semiconductor material 52, and then exposed to a second set of precursors for selectively growing the second semiconductor material 54. The first set of precursors includes precursors for the first semiconductor material (e.g., silicon germanium), and the second set of precursors includes precursors for the second semiconductor material (e.g., silicon). In some embodiments, the first set of precursors includes a silicon precursor (e.g., silane) and a germanium precursor (e.g., a germane), and the second set of precursors includes the silicon precursor but omits the germanium precursor. The epitaxial growth process may thus include continuously enabling a flow of the silicon precursor to the growth chamber, and then cyclically: (1) enabling a flow of the germanium precursor to the growth chamber when growing the first semiconductor material 52; and (2) disabling the flow of the germanium precursor to the growth chamber when growing the second semiconductor material 54. The cyclical exposure may be repeated until a target quantity of layers is formed.

FIGS. 3A, 3B, 4A, 4B, 5A-5C, 6A-6C, 7A-7C, 8A, 8B, 9A, 9B, 10A, 10B, 11-14, 15A, and 15B are cross-sectional views of the NSFET device 100 at subsequent stages of manufacturing, in accordance with an embodiment. FIGS. 3A, 4A, 5A, 6A, 7A, 8A, 9A, 10A, and 15A are cross-sectional views along cross-section B-B in FIG. 1. FIGS. 3B, 4B, 5C, 6C, 7C, 8B, 9B, 10B, and 15B are cross-sectional views along cross-section A-A in FIG. 1. FIGS. 5B, 6B, and 7B are cross-sectional views along cross-section D-D in FIG. 1. FIGS. 11-14 are cross-sectional views of a portion of the NSFET device along cross-section A-A in FIG. 1. Although two fins and two gate structures are illustrated in the figures as a non-limiting example, it should be appreciated that other numbers of fins and other numbers of gate structures may also be formed.

Figure 3A:
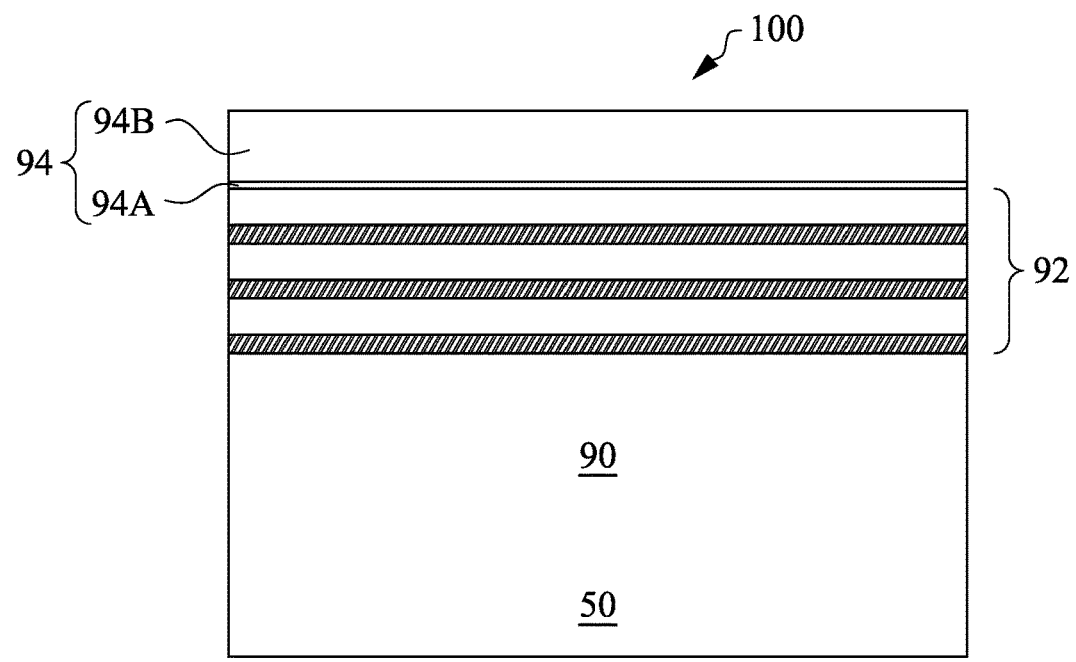
Figure 3B:
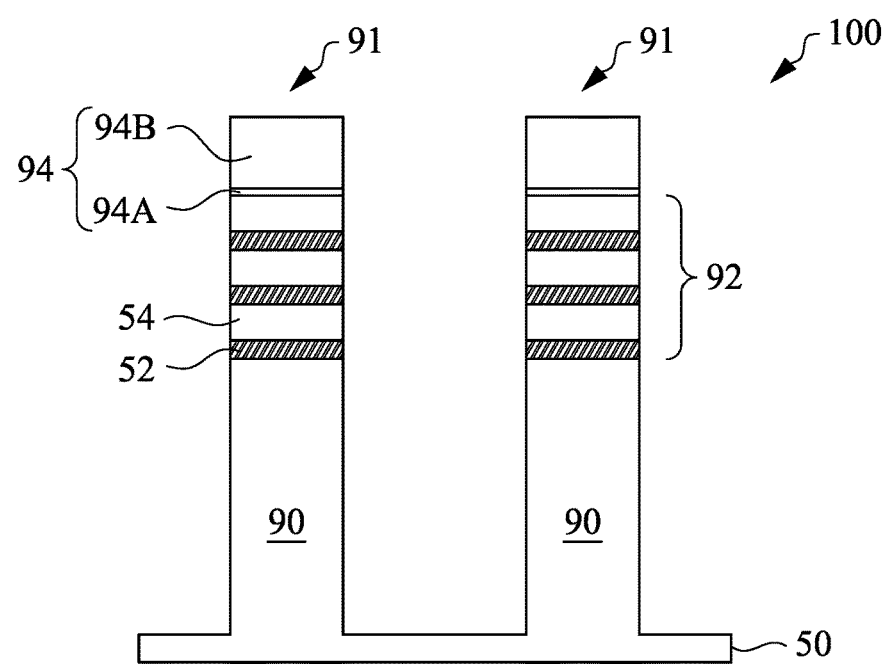

In FIG. 3A and 3B, fin structures 91 are formed protruding above the substrate 50. Each of the fin structures 91 includes a semiconductor fin 90 and a nanostructure 92 overlying the semiconductor fin 90. The nanostructures 92 and the semiconductor fins 90 may be formed by etching trenches in the multi-layer stack 64 and the substrate 50, respectively.

The fin structures 91 may be patterned by any suitable method. For example, the fin structures 91 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern, e.g., the fin structures 91.

In some embodiments, the remaining spacers are used to pattern a mask 94, which is then used to pattern the fin structures 91. The mask 94 may be a single layer mask, or may be a multilayer mask such as a multilayer mask that includes a first mask layer 94A and a second mask layer 94B. The first mask layer 94A and second mask layer 94B may each be formed from a dielectric material such as silicon oxide, silicon nitride, a combination thereof, or the like, and may be deposited or thermally grown according to suitable techniques. The first mask layer 94A and second mask layer 94B are different materials having a high etching selectivity. For example, the first mask layer 94A may be silicon oxide, and the second mask layer 94B may be silicon nitride. The mask 94 may be formed by patterning the first mask layer 94A and the second mask layer 94B using any acceptable etching process. The mask 94 may then be used as an etching mask to etch the substrate 50 and the multi-layer stack 64. The etching may be any acceptable etch process, such as a reactive ion etch (RIE), neutral beam etch (NBE), the like, or a combination thereof. The etching is an anisotropic etching process, in some embodiments. After the etching process, the patterned multi-layer stack 64 form the nanostructures 92, and the patterned substrate 50 form the semiconductor fins 90, as illustrated in FIG. 3A and 3B. Therefore, in the illustrated embodiment, the nanostructure 92 also includes alternating layers of the first semiconductor material 52 and the second semiconductor material 54, and the semiconductor fin 90 is formed of a same material (e.g., silicon) as the substrate 50.

Figure 4A:
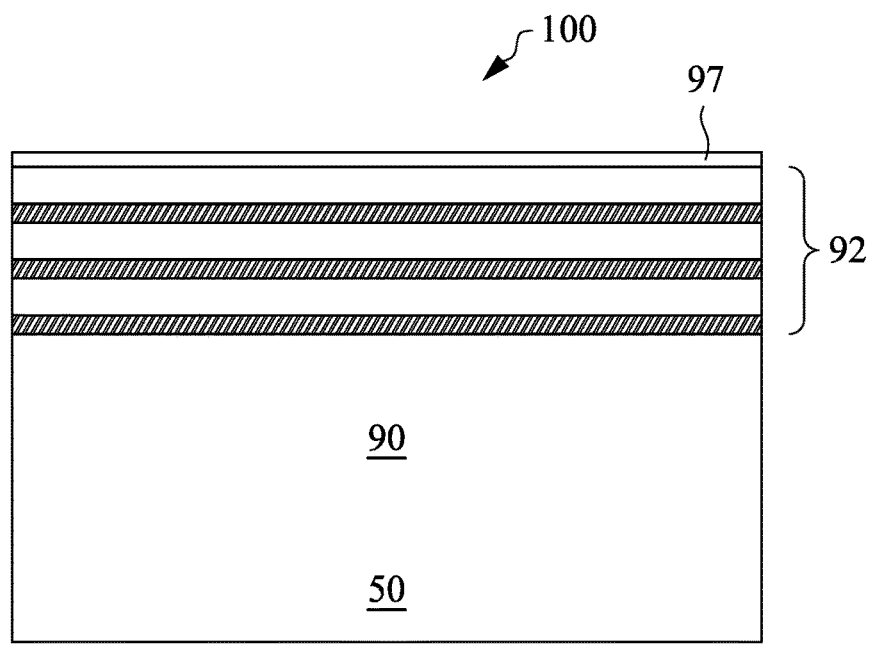
Figure 4B:
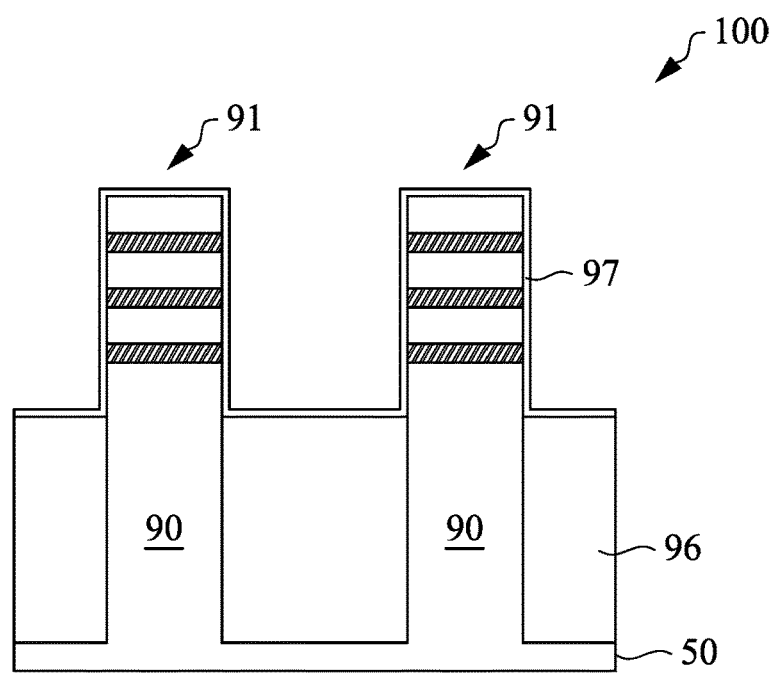

Next, in FIGS. 4A and 4B, Shallow Trench Isolation (STI) regions 96 are formed over the substrate 50 and on opposing sides of the fin structures 91. As an example to form the STI regions 96, an insulation material may be formed over the substrate 50. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed after the insulation material is formed.

In an embodiment, the insulation material is formed such that excess insulation material covers the fin structures 91. In some embodiments, a liner is first formed along surfaces of the substrate 50 and fin structures 91, and a fill material, such as those discussed above is formed over the liner. In some embodiments, the liner is omitted.

Next, a removal process is applied to the insulation material to remove excess insulation material over the fin structures 91. In some embodiments, a planarization process such as a chemical mechanical polish (CMP), an etch back process, combinations thereof, or the like may be utilized. The planarization process exposes the nanostructures 92 such that top surfaces of the nanostructure 92 and the insulation material are level after the planarization process is complete. Next, the insulation material is recessed to form the STI regions 96. The insulation material is recessed such that the nanostructures 92 protrude from between neighboring STI regions 96. Top portions of the semiconductor fins 90 may also protrude from between neighboring STI regions 96. Further, the top surfaces of the STI regions 96 may have a flat surface as illustrated, a convex surface, a concave surface (such as dishing), or a combination thereof. The top surfaces of the STI regions 96 may be formed flat, convex, and/or concave by an appropriate etch. The STI regions 96 may be recessed using an acceptable etching process, such as one that is selective to the material of the insulation material (e.g., etches the material of the insulation material at a faster rate than the material of the semiconductor fins 90 and the nanostructures 92). For example, a chemical oxide removal with a suitable etchant such as dilute hydrofluoric (dHF) acid may be used.

Still referring to FIGS. 4A and 4B, a dummy dielectric layer 97 is formed over the nanostructures 92 and over the STI regions 96. The dummy dielectric layer 97 may be, for example, silicon oxide, silicon nitride, a combination thereof, or the like, and may be deposited or thermally grown according to acceptable techniques. In an embodiment, a layer of silicon is conformally formed over the nanostructure 92 and over the upper surface of the STI regions 96, and a thermal oxidation process is performed to convert the deposited silicon layer into an oxide layer as the dummy dielectric layer 97.

Figure 5A:
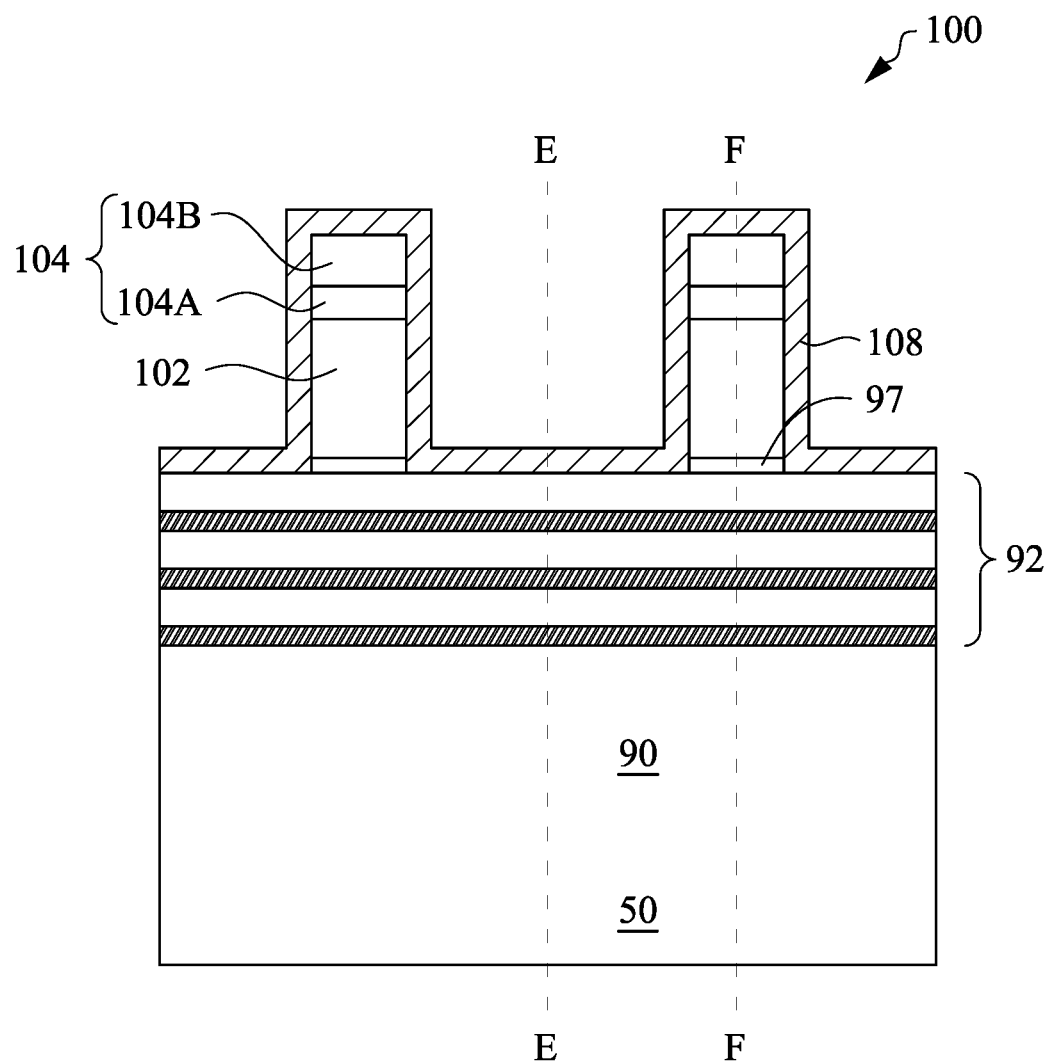
Figure 5B:
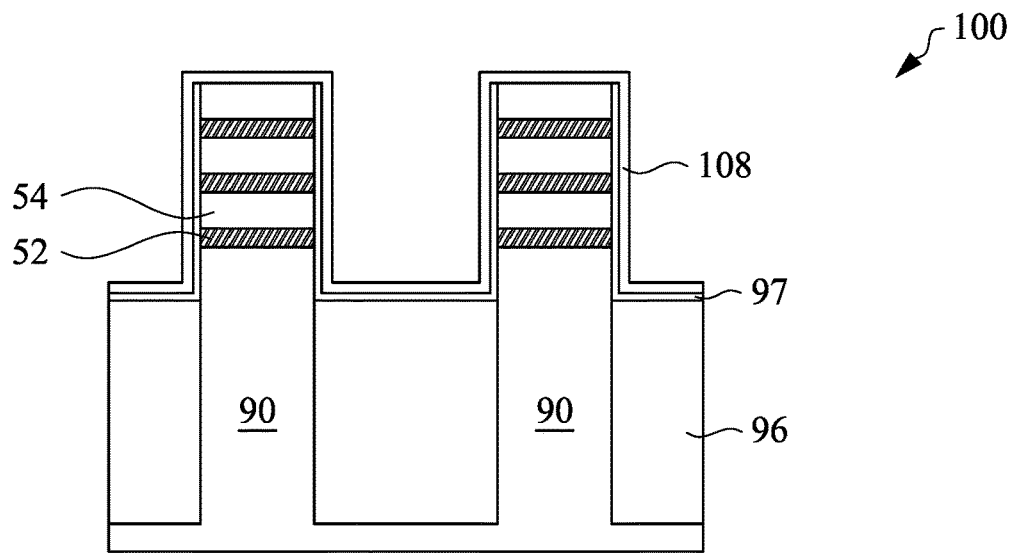
Figure 5C:
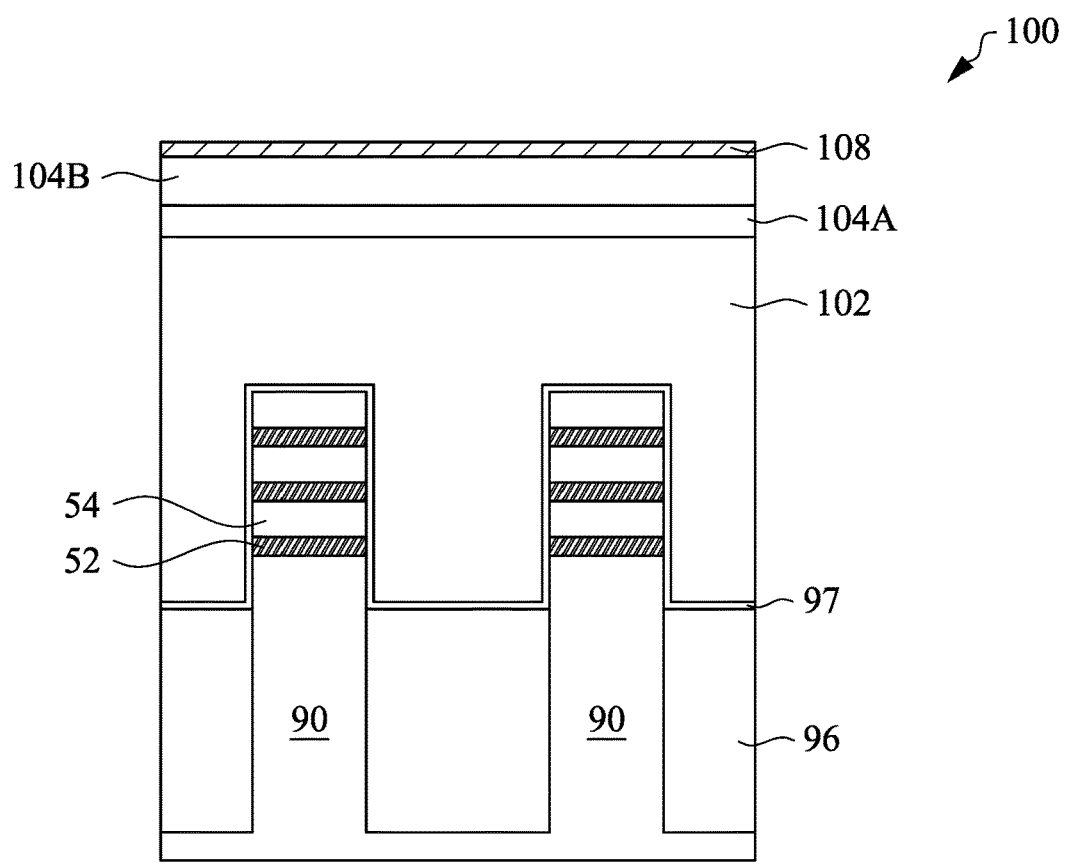

Next, in FIGS. 5A-5C, dummy gates 102 are formed over the fins 90 and over the nanostructures 92. To form the dummy gates 102, a dummy gate layer may be formed over the dummy dielectric layer 97. The dummy gate layer may be deposited over the dummy dielectric layer 97 and then planarized, such as by a CMP. The dummy gate layer may be a conductive material and may be selected from a group including amorphous silicon, polycrystalline-silicon (poly-silicon), poly-crystalline silicon-germanium (poly-SiGe), or the like. The dummy gate layer may be deposited by physical vapor deposition (PVD), CVD, sputter deposition, or other techniques known and used in the art. The dummy gate layer may be made of other materials that have a high etching selectivity from the isolation regions 96.

Masks 104 are then formed over the dummy gate layer. The masks 104 may be formed from silicon nitride, silicon oxynitride, combinations thereof, or the like, and may be patterned using acceptable photolithography and etching techniques. In the illustrated embodiment, the mask 104 includes a first mask layer 104A (e.g., a silicon oxide layer) and a second mask layer 104B (e.g., a silicon nitride layer). The pattern of the masks 104 is then transferred to the dummy gate layer by an acceptable etching technique to form the dummy gates 102, and then transferred to the dummy dielectric layer by acceptable etching technique to form dummy gate dielectrics 97. The dummy gates 102 cover respective channel regions of the nanostructures 92. The pattern of the masks 104 may be used to physically separate each of the dummy gates 102 from adjacent dummy gates. The dummy gates 102 may also have a lengthwise direction substantially perpendicular to the lengthwise direction of the fins 90. The dummy gate 102 and the dummy gate dielectric 97 are collectively referred to as dummy gate structure, in some embodiments.

Next, a gate spacer layer 108 is formed by conformally depositing an insulating material over the nanostructures 92, STI regions 96, and dummy gates 102. The insulating material may be silicon nitride, silicon carbonitride, a combination thereof, or the like. In some embodiments, the gate spacer layer 108 includes multiple sublayers. For example, a first sublayer (sometimes referred to as a gate seal spacer layer) may be formed by thermal oxidation or a deposition, and a second sublayer (sometimes referred to as a main gate spacer layer) may be conformally deposited on the first sublayer.

FIGS. 5B and 5C illustrate cross-sectional views of the NSFET device 100 in FIG. 5A, but along cross-sections E-E and F-F in FIG. 5A, respectively. The cross-sections E-E and F-F correspond to cross-sections D-D and A-A in FIG. 1, respectively.

Figure 6A:
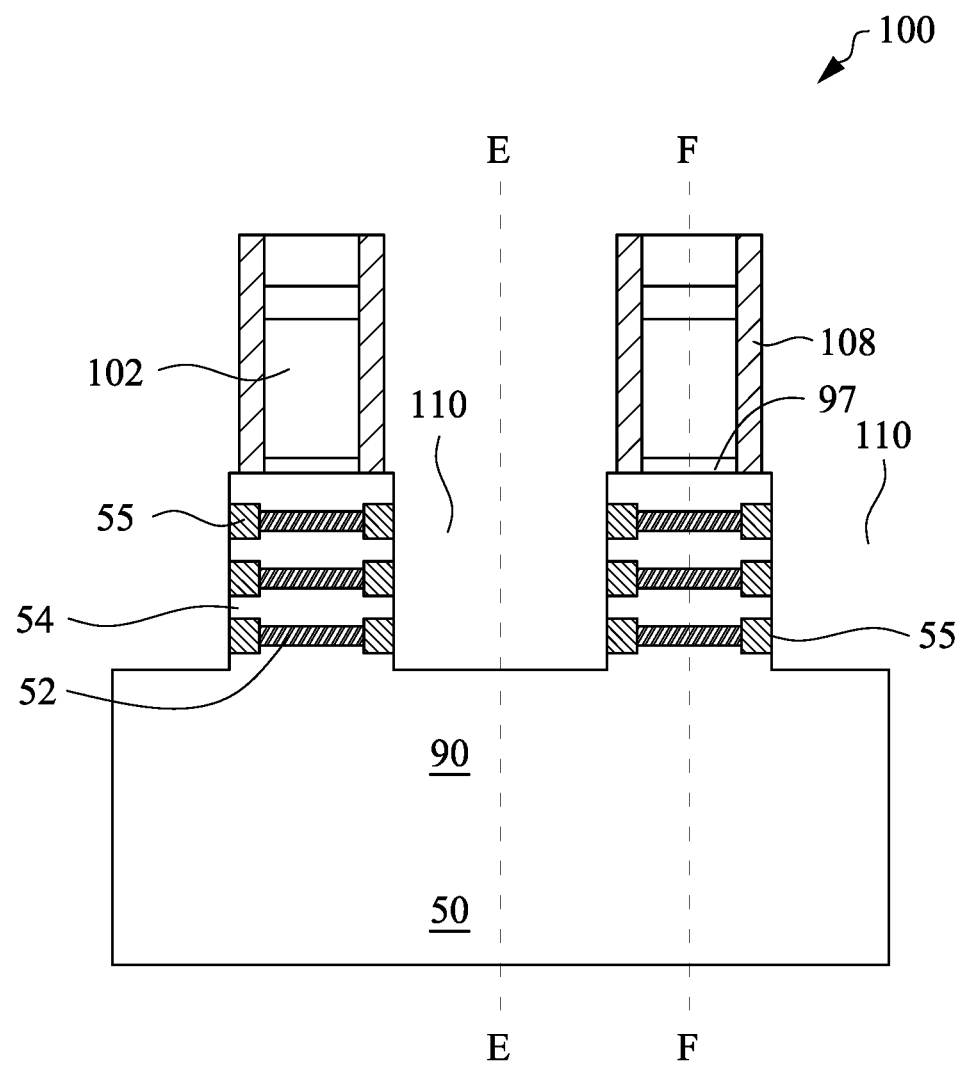
Figure 6B:
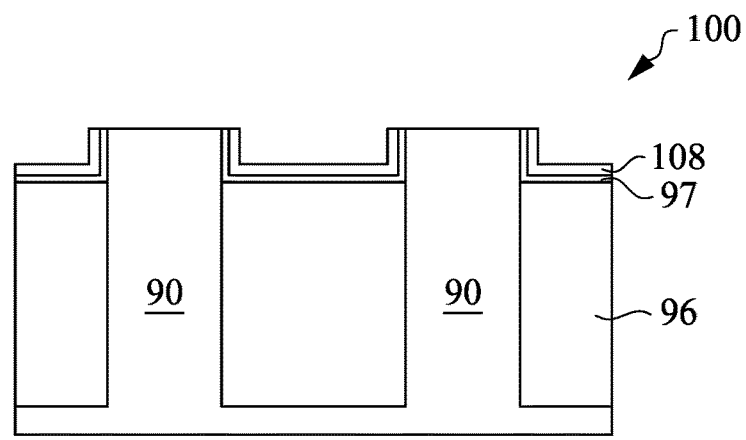
Figure 6C:
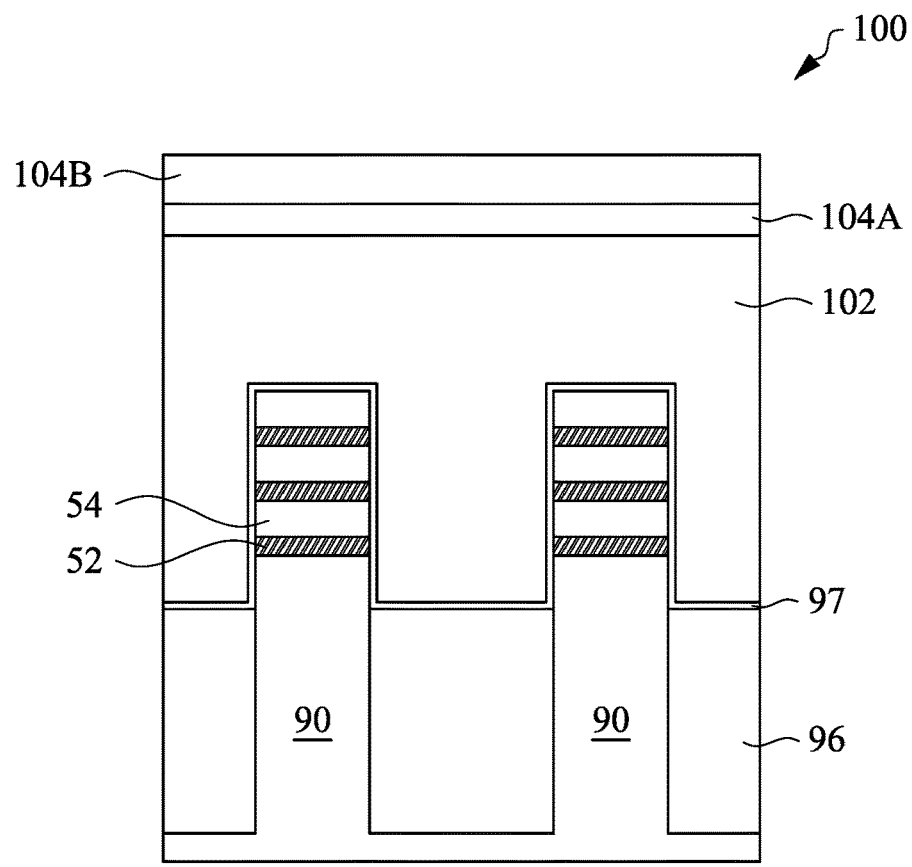

Next, in FIGS. 6A-6C, the gate spacer layers 108 are etched by an anisotropic etching process to form gate spacers 108. The anisotropic etching process may remove horizontal portions of the gate spacer layer 108 (e.g., portions over the STI regions 96 and dummy gates 102), with remaining vertical portions of the gate spacer layer 108 (e.g., along sidewalls of the dummy gates 102 and the dummy gate dielectric 97) forming the gate spacers 108.

FIGS. 6B and 6C illustrate cross-sectional views of the NSFET device 100 in FIG. 6A, but along cross-sections E-E and F-F, respectively. In FIG. 6B, portions of the gate spacer layer 108 are illustrated between neighboring fins on the upper surface of the STI regions 96. These portions of the gate spacer layer 108 may remain because the anisotropic etching process discussed above may not completely remove the gate spacer layer 108 disposed between neighboring fins, due to the small distance between the neighboring fins reducing the efficiency of the anisotropic etching process. In other embodiments, the portions of the gate spacers layers 108 disposed on the upper surface of the STI regions 96 between neighboring fins are completely removed by the anisotropic etching process.

After the formation of the gate spacers 108, implantation for lightly doped source/drain (LDD) regions (not shown) may be performed. Appropriate type (e.g., p-type or n-type) impurities may be implanted into the exposed nanostructures 92 and/or semiconductor fins 90. The n-type impurities may be the any suitable n-type impurities, such as phosphorus, arsenic, antimony, or the like, and the p-type impurities may be the any suitable p-type impurities, such as boron, $BF_2$, indium, or the like. The lightly doped source/drain regions may have a concentration of impurities of from about $10^{15}$ cm$^{-3}$ to about $10^{16}$ cm$^{-3}$. An anneal process may be used to activate the implanted impurities.

Next, openings 110 (may also be referred to as recesses) are formed in the nanostructures 92. The openings 110 may extend through the nanostructures 92 and into the semiconductor fins 90. The openings 110 may be formed by any acceptable etching technique, using, e.g., the dummy gates 102 as an etching mask.

After the openings 110 are formed, a selective etching process is performed to recess end portions of the first semiconductor material 52 exposed by the openings 110 without substantially attacking the second semiconductor material 54. After the selective etching process, recesses are formed in the first semiconductor material 52 at locations where the removed end portions used to be.

Next, an inner spacer layer is formed (e.g., conformally) in the opening 110. The inner spacer layer also fills the recesses in the first semiconductor material 52 formed by the previous selective etching process. The inner spacer layer may be a suitable dielectric material, such as silicon carbon nitride (SiCN), silicon oxycarbonitride (SiOCN), or the like, formed by a suitable deposition method such as PVD, CVD, ALD, or the like. Next, an etching process, such as an anisotropic etching process, is performed to remove portions of the inner spacer layers disposed outside the recesses in the first semiconductor material 52. The remaining portions of the inner spacer layers (e.g., portions disposed inside the recesses in the first semiconductor material 52) form the inner spacers 55. FIGS. 6B and 6C illustrate cross-sectional views of the NSFET device 100 in FIG. 6A, but along cross-sections E-E and F-F in FIG. 6A, respectively.

Figure 7A:
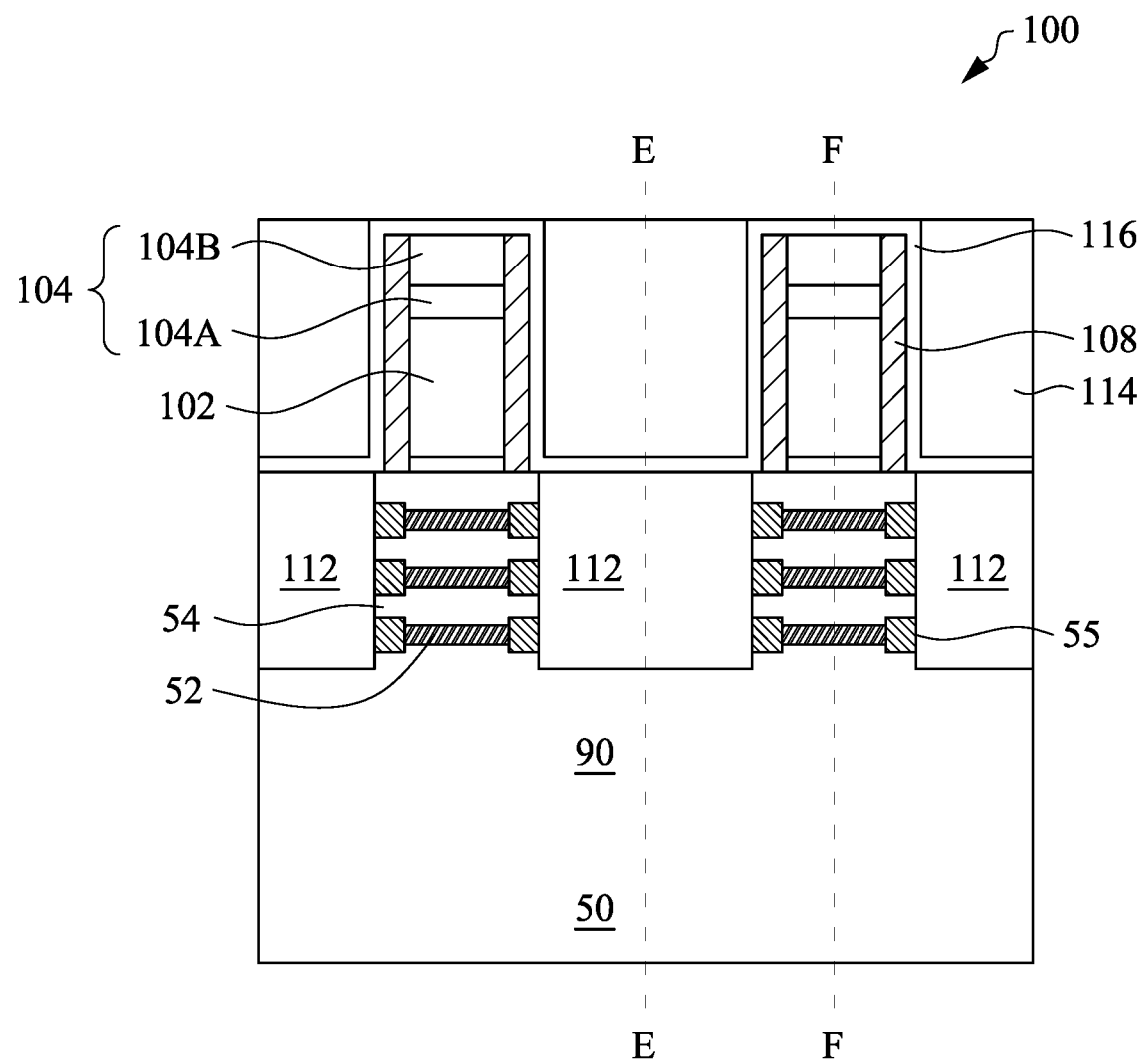
Figure 7B:
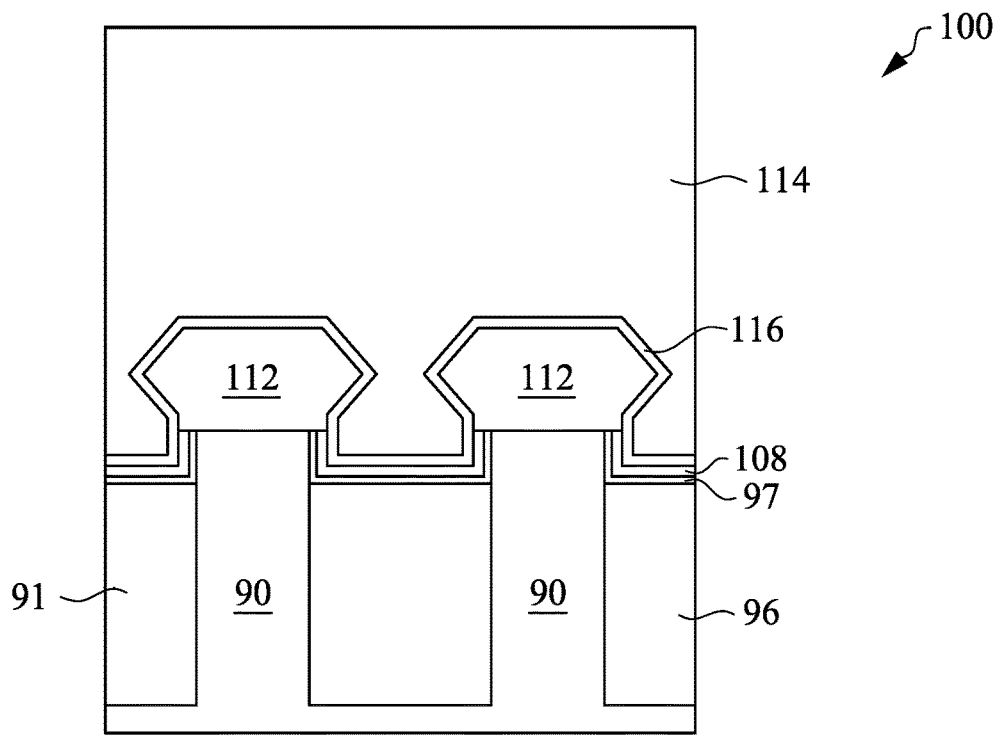
Figure 7C:
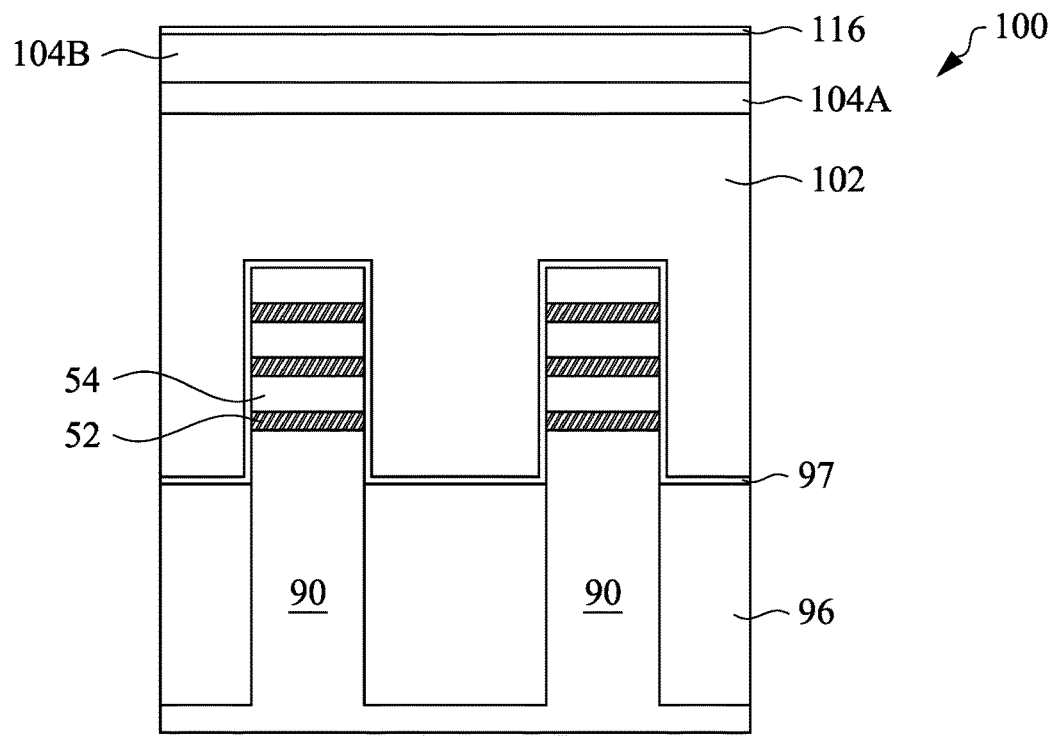

Next, in FIGS. 7A-7C, source/drain regions 112 are formed in the openings 110. In the illustrated embodiment, the source/drain regions 112 are formed of an epitaxial material(s), and therefore, may also be referred to as epitaxial source/drain regions 112. In some embodiments, the epitaxial source/drain regions 112 are formed in the openings 110 to exert stress in the respective channel regions of the NSFET device formed, thereby improving performance. The epitaxial source/drain regions 112 are formed such that each dummy gate 102 is disposed between respective neighboring pairs of the epitaxial source/drain regions 112. In some embodiments, the gate spacers 108 are used to separate the epitaxial source/drain regions 112 from the dummy gates 102 by an appropriate lateral distance so that the epitaxial source/drain regions 112 do not short out subsequently formed gates of the resulting NSFET device.

The epitaxial source/drain regions 112 are epitaxially grown in the openings 110. The epitaxial source/drain regions 112 may include any acceptable material, such as appropriate for n-type or p-type device. For example, when n-type devices are formed, the epitaxial source/drain regions 112 may include materials exerting a tensile strain in the channel regions, such as silicon, SiC, SiCP, SiP, or the like. Likewise, when p-type devices are formed, the epitaxial source/drain regions 112 may include materials exerting a compressive strain in the channel regions, such as SiGe, SiGeB, Ge, GeSn, or the like. The epitaxial source/drain regions 112 may have surfaces raised from respective surfaces of the fins and may have facets.

The epitaxial source/drain regions 112 and/or the fins may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 112 may be in situ doped during growth.

As a result of the epitaxy processes used to form the epitaxial source/drain regions 112, upper surfaces of the epitaxial source/drain regions 112 have facets which expand laterally outward beyond sidewalls of the fins 90. In the illustrated embodiment, adjacent epitaxial source/drain regions 112 remain separated (see FIG. 7B) after the epitaxy process is completed. In other embodiments, these facets cause adjacent epitaxial source/drain regions 112 of a same NSFET to merge.

Next, a contact etch stop layer (CESL) 116 is formed (e.g., conformally) over the source/drain regions 112 and over the dummy gate 102, and a first inter-layer dielectric (ILD) 114 is then deposited over the CESL 116. The CESL 116 is formed of a material having a different etch rate than the first ILD 114, and may be formed of silicon nitride using PECVD, although other dielectric materials such as silicon oxide, silicon oxynitride, combinations thereof, or the like, and alternative techniques of forming the CESL 116, such as low pressure CVD (LPCVD), PVD, or the like, could alternatively be used.

The first ILD 114 may be formed of a dielectric material, and may be deposited by any suitable method, such as CVD, plasma-enhanced CVD (PECVD), or FCVD. Dielectric materials for the first ILD 114 may include silicon oxide, Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. FIGS. 7B and 7C illustrate cross-sectional views of the NSFET device 100 of FIG. 7A, but along cross-section E-E and F-F in FIG. 7A, respectively.

Figure 8A:
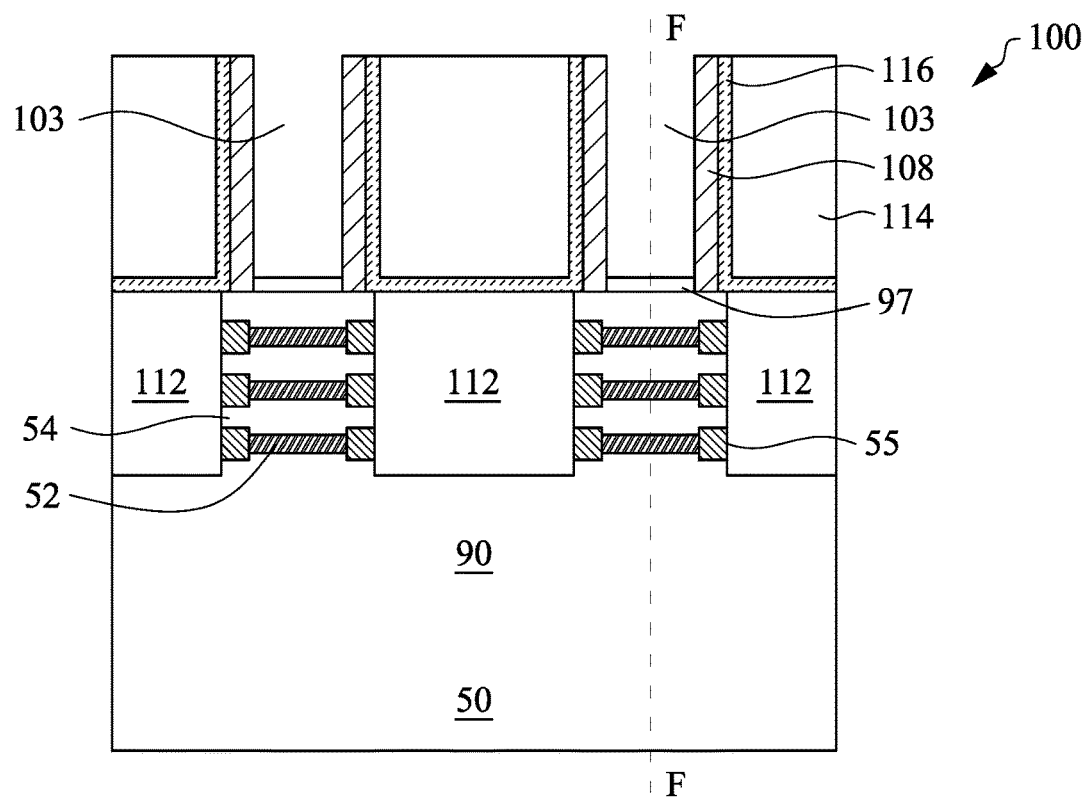
Figure 8B:
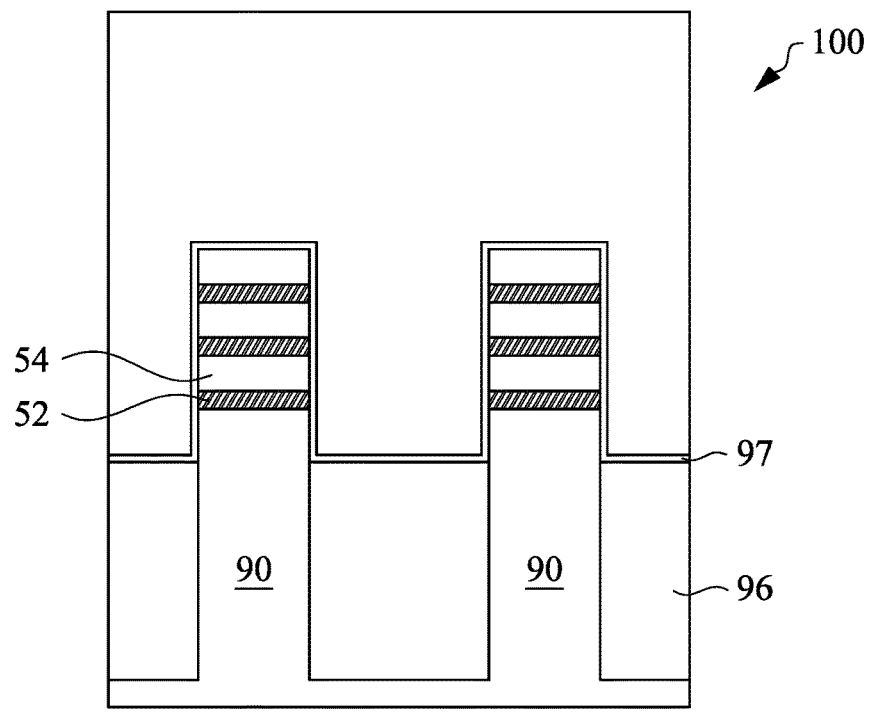

Next, in FIGS. 8A and 8B, the dummy gates 102 are removed. To remove the dummy gates 102, a planarization process, such as a CMP, is performed to level the top surfaces of the first ILD 114 and CESL 116 with the top surfaces of the dummy gates 102 and gate spacers 108. The planarization process may also remove the masks 104 (see FIG. 7A) on the dummy gates 102, and portions of the gate spacers 108 along sidewalls of the masks 104. After the planarization process, top surfaces of the dummy gates 102, gate spacers 108, and first ILD 114 are level. Accordingly, the top surfaces of the dummy gates 102 are exposed through the first ILD 114.

Next, the dummy gates 102 are removed in an etching step(s), so that recesses 103 are formed. In some embodiments, the dummy gates 102 are removed by an anisotropic dry etch process. For example, the etching process may include a dry etch process using reaction gas(es) that selectively etch the dummy gates 102 without etching the first ILD 114 or the gate spacers 108. Each recess 103 exposes a channel region of the NSFET. Each channel region is disposed between neighboring pairs of the epitaxial source/drain regions 112. During the removal of the dummy gates 102, the dummy gate dielectric 97 may be used as an etch stop layer when the dummy gates 102 are etched. The dummy gate dielectric 97 may then be removed after the removal of the dummy gates 102. FIG. 8B illustrates the cross-sectional view of the NSFET device 100 of FIG. 8A, but along the cross-section F-F.

Figure 9A:
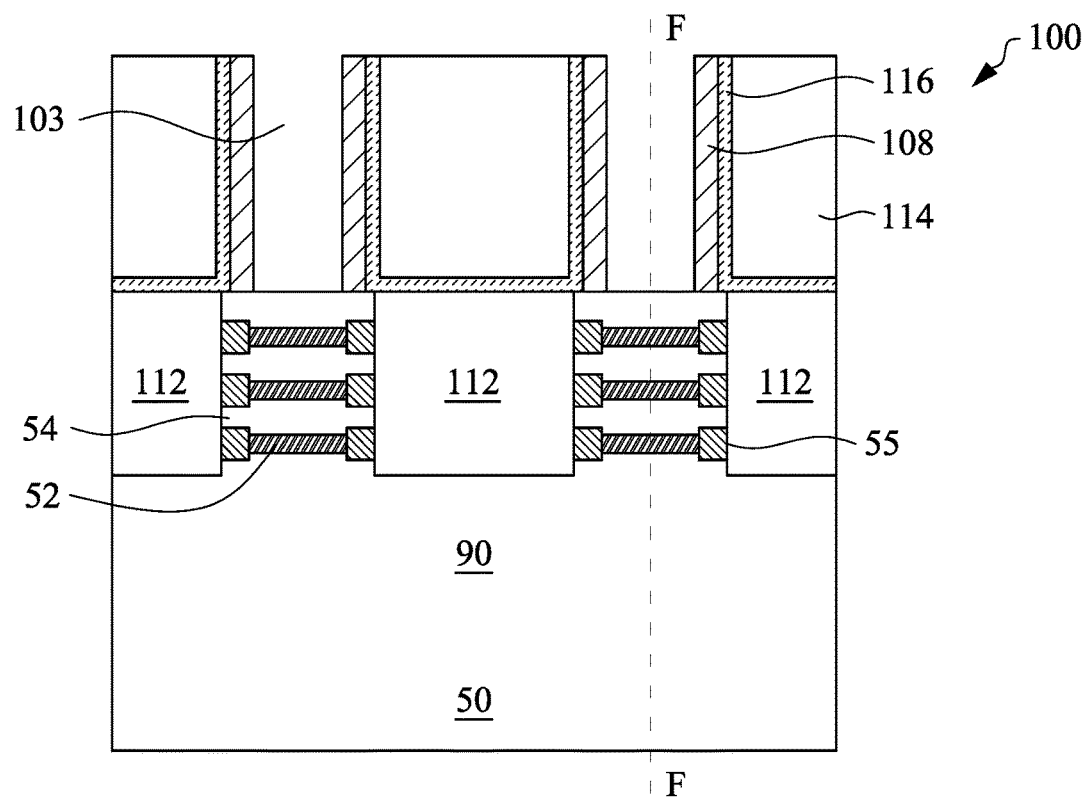
Figure 9B:
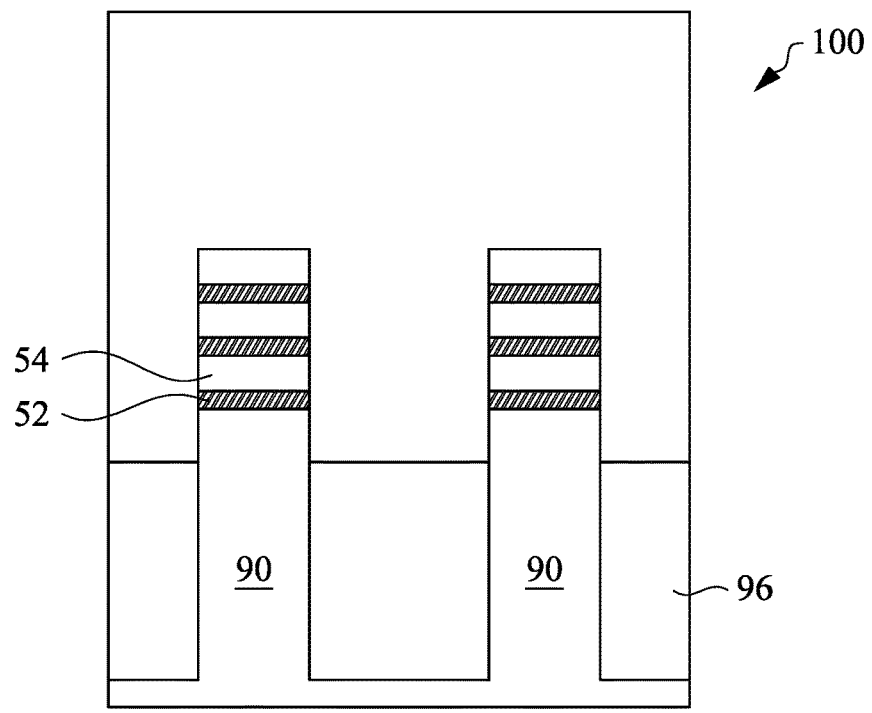

Next, in FIGS. 9A and 9B, the dummy gate dielectric 97 in the recesses 103 is removed. An etching process, such as an isotropic etching process, may be performed to remove the dummy gate dielectric 97. In an embodiment, an isotropic etching process using an etching gas that comprises HF and NH$_3$ is performed to remove the dummy gate dielectric 97.

Figure 10A:
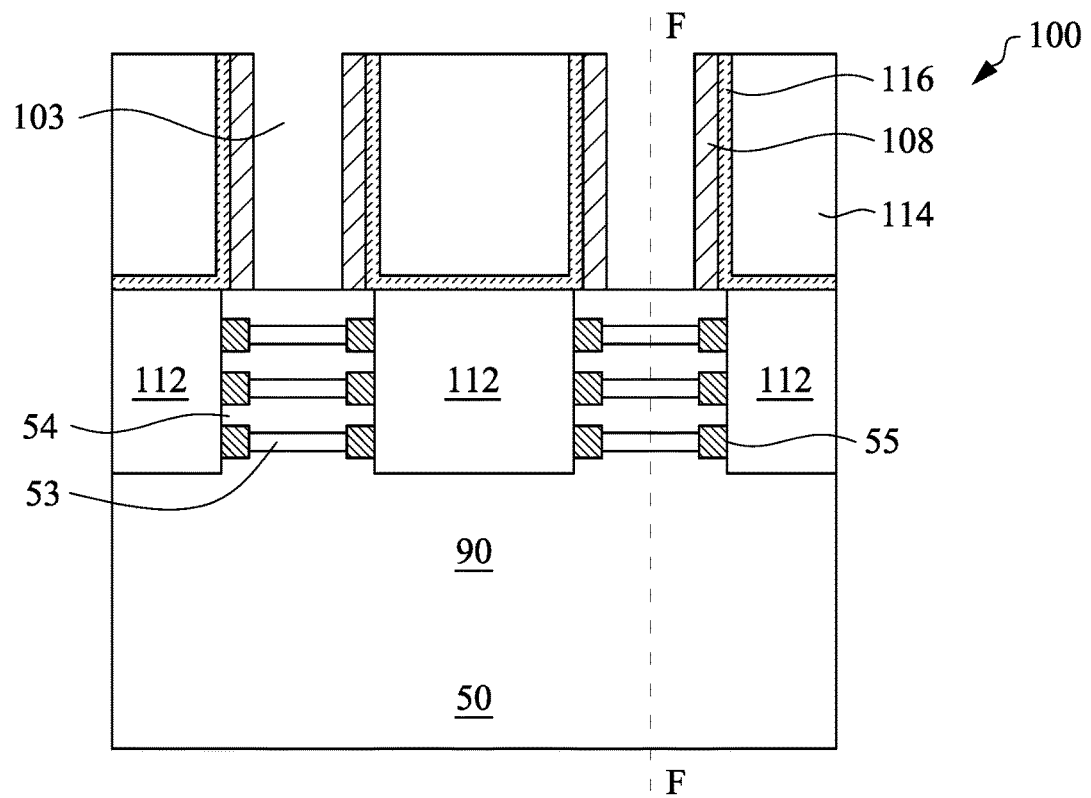
Figure 10B:
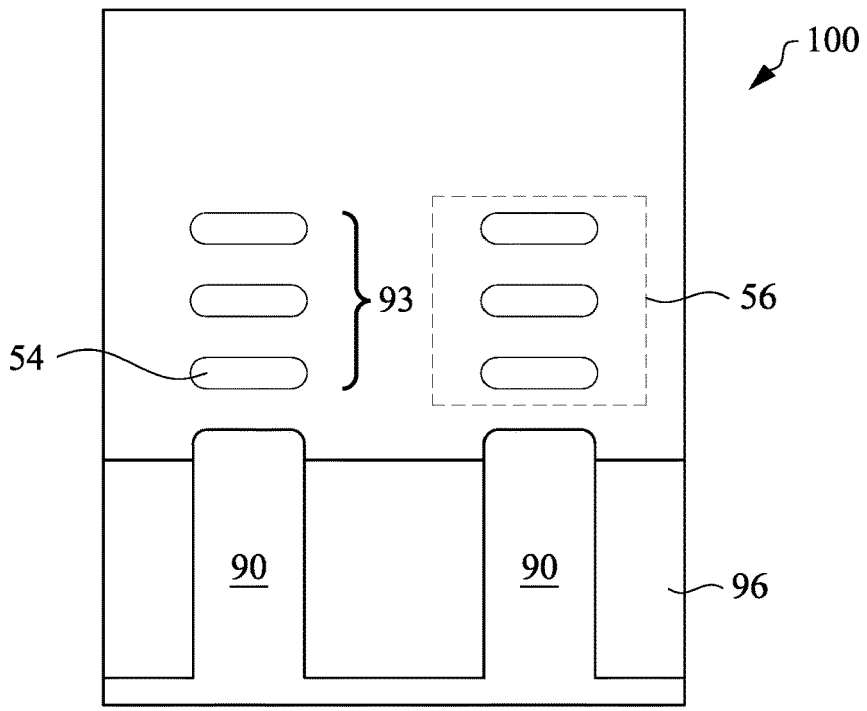

Next, in FIGS. 10A and 10B, the first semiconductor material 52 is removed to release the second semiconductor material 54. After the first semiconductor material 52 is removed, the second semiconductor material 54 forms a plurality of nanosheets 54 that extend horizontally (e.g., parallel to a major upper surface of the substrate 50). The nanosheets 54 may be collectively referred to as the channel regions 93 or the channel layers 93 of the NSFET device 100 formed. As illustrated in FIG. 10A, gaps 53 (e.g., empty spaces) are formed between the nanosheets 54 by the removal of the first semiconductor material 52.

In some embodiments, the first semiconductor material 52 is removed by a selective etching process using an etchant that is selective to (e.g., having a higher etch rate for) the first semiconductor material 52, such that the first semiconductor material 52 is removed without substantially attacking the second semiconductor material 54. In an embodiment, an isotropic etching process is performed to remove the first semiconductor material 52. The isotropic etching process may be performed using an etching gas, and optionally, a carrier gas, where the etching gas comprises F$_2$ and HF, and the carrier gas may be an inert gas such as Ar, He, N$_2$, combinations thereof, or the like.

FIG. 10A illustrates the cross-sectional view of the NSFET device 100 along a longitudinal axis of the fin (e.g., along a current flow direction in the fin), and FIG. 10B illustrates the cross-sectional view of the NSFET device 100 along cross-section F-F, which is a cross-section along a direction perpendicular to the longitudinal axis of the fin and across a middle portion of the nanosheet 54.

Figure 11:
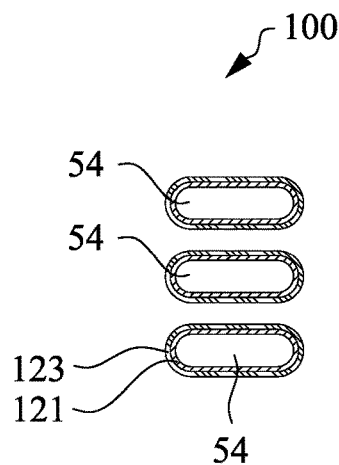
Figure 12:
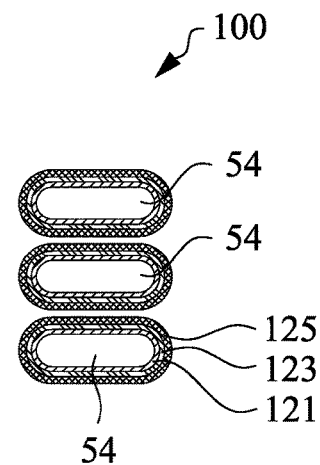
Figure 13:
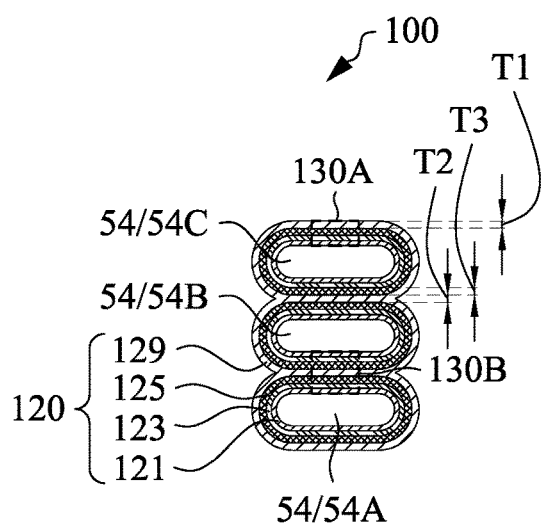

FIGS. 11-13 illustrate subsequent processing steps to form a gate layer stack 120 (see, e.g., FIGS. 15A and 15B) around the nanosheets 54 and along sidewalls of the recesses 103, where the gate layer stack 120 includes an interfacial dielectric material 121, a gate dielectric material 123, a work function material 125, and a liner material 129, in the illustrated embodiment. For simplicity, FIGS. 11-13 illustrate the cross-sectional views of a portion of the NSFET device 100 within an area 56 of FIG. 10B.

Referring next to FIG. 11, an interfacial dielectric material 121 and a gate dielectric material 123 are successively formed around each of the nanosheets 54. Although not illustrated in FIGS. 11-13 (but illustrated in FIGS. 15B), the different constituent materials of the gate layer stack 120 are also formed over the exposed surfaces of the fins 90 and over the upper surface of the STI regions 96, as illustrated in FIG. 15B.

The interfacial dielectric material 121 is a suitable dielectric material, such as silicon oxide formed by a suitable method, such as CVD, PVD, ALD, thermal oxidation, or the like. In an embodiment, the interfacial dielectric material 121 is formed by converting an exterior portion of the nanosheets 54 (e.g., silicon) into an oxide (e.g., silicon oxide) through a thermal oxidization process. A thickness of the interfacial dielectric material 121 is between about 5 angstroms and about 20 angstroms, as an example.

Next, the gate dielectric material 123 is formed (e.g., conformally) around the nanosheets 54 and around the interfacial dielectric material 121. In accordance with some embodiments, the gate dielectric material 123 comprises silicon oxide, silicon nitride, or multilayers thereof. In some embodiments, the gate dielectric material 123 includes a high-k dielectric material, and in these embodiments, the gate dielectric material 123 may have a k value greater than about 7.0, and may include a metal oxide or a silicate of Hf, Al, Zr, La, Mg, Ba, Ti, or Pb, or combinations thereof. The formation methods of the gate dielectric material 123 may include Molecular-Beam Deposition (MBD), ALD, PECVD, and the like. As an example, the gate dielectric material may have a thickness between about 5 angstroms and about 35 angstroms.

Next, in FIG. 12, the work function material 125 is formed around the nanosheets 54 and around the gate dielectric material 123. Exemplary p-type work function materials (may also be referred to as p-type work function metals) include TiN, TaN, Ru, Mo, Al, WN, ZrSi$_2$, MoSi$_2$, TaSi$_2$, NiSi$_2$, WN, other suitable p-type work function materials, or combinations thereof. Exemplary n-type work function materials (may also be referred to as n-type work function metals) include Ti, Ag, TaAl, TaAlC, TiAlN, TaC, TaCN, TaSiN, Mn, Zr, other suitable n-type work function materials, or combinations thereof. A work function value is associated with the material composition of the work function material, and thus, the work function material is chosen to tune its work function value so that a target threshold voltage V$_{TH}$ is achieved in the device that is to be formed. The work function material(s) may be deposited by ALD, CVD, physical vapor deposition (PVD), and/or other suitable process. In an embodiment, the NSFET device 100 is an n-type device, and the work function material 125 is titanium aluminum (TiAl) formed by ALD. A thickness of the work function material 125 is between about 10 angstroms and about 40 angstroms, in some embodiments. If the thickness of the work function material 125 is too small (e.g., smaller than about 10 angstroms), the work function material 125 may not form a continuous film (e.g., may have pin holes), and the aluminum in the work function material 125 (e.g., TiAl) may not be sufficient to adjust the work function of the work function material 125. If the thickness of the work function material 125 is too large (e.g., larger than about 40 angstroms), the work function material 125 may take up too much space and it may be difficult to form other layers between adjacent nanosheets 54.

Next, in FIG. 13, the liner material 129 is formed (e.g., conformally) around the nanosheets 54 and around the work function material 125. In the illustrated embodiment, the liner material 129 is formed of a material capable of preventing or reducing diffusion of aluminum from the work function material 125 (e.g., TiAl) into other layers of the NSFET device 100. The liner material 129 may be formed of aluminum oxide, silicon oxide, or silicon, as examples. Any suitable formation method, such as ALD, PVD, CVD, or the like, may be used to form the liner material 129. A thickness of the liner material 129 is between about 5 angstroms and about 30 angstroms, in some embodiments. The lower boundary of the above disclosed range for the thickness of the liner material 129 ensures formation of a continuous layer without pin holes, and the upper boundary of the above disclosed range may be determined by design constraints, e.g., the space remaining between adjacent nanosheets 54. The interfacial dielectric material 121, the gate dielectric material 123, the work function material 125, and the liner material 129 are collectively referred to as a gate layer stack 120 in the discussion herein.

In an embodiment, the liner material 129 is aluminum oxide. Any suitable formation method may be used to form the aluminum oxide. For example, an ALD process using trimethylaluminium (e.g., $Al_2(CH_3)_6$, also referred to as TMA) as a first precursor (e.g., an aluminum-containing precursor) and $H_2O$ as a second precursor (e.g., an oxygen-containing precursor) may be performed to form the liner material 129. The chemical reaction between the first precursor and the second precursor may be described by the following chemical equation:

$$Al_2(CH_3)_6 + H_2O \rightarrow AlO + CH_3 + CH_4$$

As another example, the aluminum oxide for the liner material 129 may be formed by, e.g., an ALD or a CVD process, using dimethylaluminum isopropoxide (e.g., $(CH_3)_2AlOCH(CH_3)_2$, also referred to as DMAI) and $H_2O$ as precursors. As yet another example, the aluminum oxide for the liner material 129 may be formed by, e.g., an ALD or a CVD process, using $AlCl_3$ and $H_2O$ as precursors.

In an embodiment, the liner material 129 is silicon, and may be formed using a suitable formation method such as PVD, CVD, ALD, or the like. A silicon-containing precursor, such as silane, disilane, or the like, may be used to form silicon as the liner material 129. In yet another embodiment, the liner material 129 is silicon oxide, and may be formed by forming silicon first, then oxidizing the silicon formed to form silicon oxide as the liner material 129. For example, the liner material 129 (e.g., silicon oxide) may be formed by soaking silane or disilane in an oxygen-containing ambient air at a temperature between about 250° C. and about 650° C.

In U.S. patent application Ser. No. 16/904,751, two layers of liner material (e.g., titanium nitride, tantalum nitride, or titanium carbide) are formed around each nanosheet, and the work function material around each nanosheet is sandwiched between the two layers of liner material. The current disclosure discloses a different structure for the liner material. In addition, the materials (e.g., aluminum oxide, silicon oxide, or silicon) disclosed in the current disclosure provide improved capability to prevent diffusion of aluminum in the work function material.

In the example of FIG. 13, the liner material 129 between adjacent nanosheets 54 merges together (e.g., physically contacts each other). For example, in area 130B of FIG. 13, which is an area between adjacent nanosheets 54, the gate layer stack 120 completely fills the space between adjacent nanosheets 54. As a result, the subsequently formed gate electrode 122 (see FIG. 15B) does not extend into the space between adjacent nanosheets 54. In other words, the space between adjacent nanosheets 54 is free of the gate electrode material. A list of the layers of materials between two adjacent nanosheets 54 (e.g., 54A and 54B) therefore includes: a layer of the interfacial dielectric material 121, a layer of the gate dielectric material 123, a layer of the work function material 125, a layer of the (merged) liner material 129, a layer of the work function material 125, a layer of the gate dielectric material 123, and a layer of the interfacial dielectric material 121.

Still referring to FIG. 13, note that in area 130A, which is an area over an uppermost nanosheet 54 (e.g., 54C) distal from the fin 90, the gate layer stack 120 has a first thickness, while in area 130B, the gate layer stack 120 has a second thickness larger than the first thickness. This is because, as discussed above, in the area 130B, the gate layer stack 120 around two adjacent nanosheets 54 merge (e.g., in physically contact) and form a thicker (merged) gate layer stack 120. In addition, since the liner material 129 between adjacent nanosheets 54 are merged together, the liner material 129 between adjacent nanosheets 54 (e.g., in area 130B) are about twice as thick as the liner material 129 at other locations, such as over the uppermost nanosheet 54 (e.g., in area 130A), or along sidewalls of the nanosheets 54. For example, in FIG. 13, the thickness T2 of the liner material 129 measured between adjacent nanosheets 54 is between about 150% and about 250%, such as between about 180% and about 220%, of the thickness T1 of the liner material 129 measured over the uppermost nanosheet 54C. In some embodiments, a ratio between the thickness T3 of the work function material 125 and the thickness T2 of the liner material 129 is in a range between about 1 and about 2. Such a ratio ensures that work function material 125 and the liner material 129 are both formed as continuous layers (e.g., without pin holes), while ensuring that the work function material 125 has sufficient aluminum for adjusting the work function, and that the liner material 129 is thick enough to prevent or reduce the diffusion of aluminum.

By forming the liner material 129 around the work function material 125, the work function material 125 around two adjacent nanosheets 54 are separated from each other, and each layer of the work function material 125 around a respective nanosheet 54 remains a conformal layer with a substantially uniform thickness (e.g., uniform within the constraints of manufacturing processes). In some embodiments, the aluminum in the work function material 125 plays an important role in determining the threshold voltage $V_{TH}$ of the NSFET device 100. Without the currently disclosed method (e.g., without the liner material 129), the work function material 125 between two adjacent nanosheets 54 may merge together and form a thicker layer of work function material 125 in the area 130B than in, e.g., the area 130A, which may results in threshold voltage variation in the device formed. In contrast, the currently disclosed method prevents merging of the work function material 125 between adjacent nanosheets 54, and therefore, ensures that the work function material 125 around each nanosheet 54 has a substantially uniform thickness. As a result, threshold voltage variation is avoided or reduced.

The liner material 129 further prevents or reduces the movement (e.g., diffusion) of the aluminum of the work function material 125 (e.g., TiAl), thus may also be referred to as a barrier layer. Note that although the liner material 129 may be an aluminum-containing material (e.g., aluminum oxide), the molecular bond between aluminum and oxygen in aluminum oxide is much stronger than the molecular bond between aluminum and titanium in titanium aluminum, and therefore, the liner material 129 does not have the aluminum diffusion problem.

Figure 14:
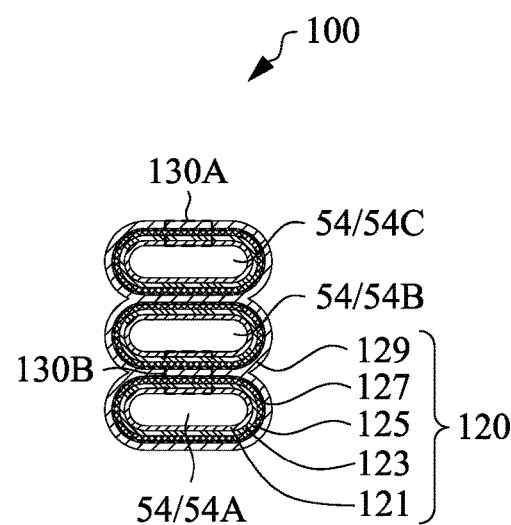

Referring now to FIG. 14, in some embodiments, after the work function material 125 is formed and before the liner material 129 is formed, a capping layer 127 is formed around the work function material 125 to protect the work function material 125. The capping layer 127 may be formed of a suitable material such as titanium nitride using a suitable formation method such as ALD, CVD, or the like. A thickness of the capping layer 127 may be less than about 20 angstroms (e.g., between 0 angstrom and about 20 angstroms). Therefore, compared with the gate layer stack 120 in FIG. 13, the gate layer stack 120 in FIG. 14 has an additional capping layer 127. As a result, in the example of FIG. 14, a list of the layers of materials between two adjacent nanosheets 54 (e.g., 54A and 54B) therefore includes: a layer of the interfacial dielectric material 121, a layer of the gate dielectric material 123, a layer of the work function material 125, a capping layer 127, a layer of the (merged) liner material 129, a capping layer 127, a layer of the work function material 125, a layer of the gate dielectric material 123, and a layer of the interfacial dielectric material 121. In FIG. 14, the thickness of the gate layer stack 120 (or the thickness of the liner material 129) in the area 130B is about twice of that in the area 130A, details are similar to FIG. 13, thus are not repeated. Discussion hereinafter uses the gate layer stack 120 in FIG. 13 as examples, with the understanding that the gate layer stack 120 in FIG. 14 may be used in all the examples to replace the gate layer stack 120 of FIG. 13.

Figure 15A:
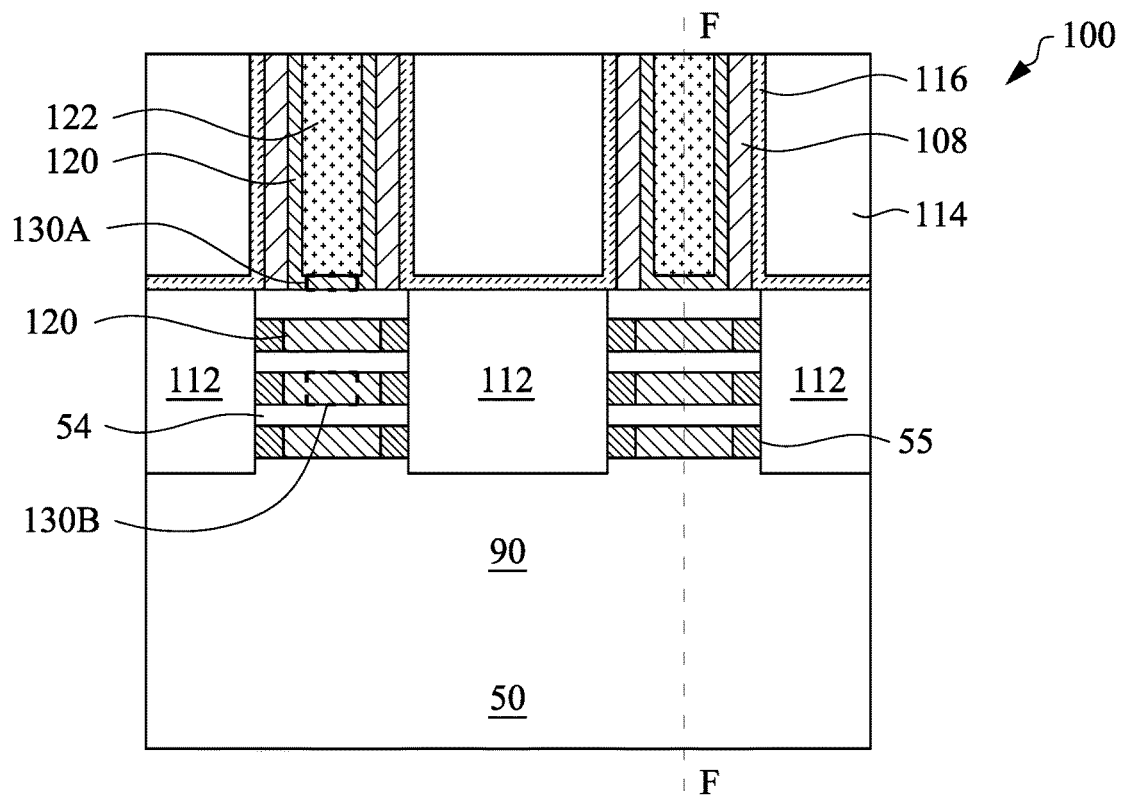
Figure 15B:
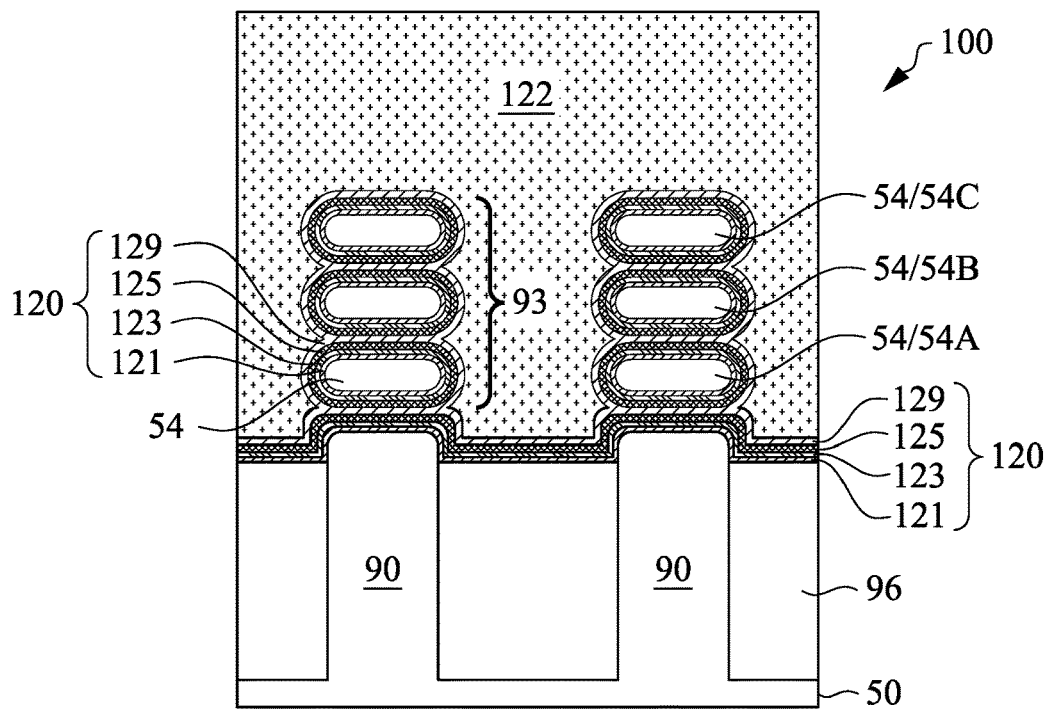

Next, in FIG. 15A and 15B, a gate electrode material (e.g., an electrically conductive material) is formed in the recesses 103 (see FIG. 10A) to form the gate electrodes 122. The gate electrode material fills the remaining portions of the recesses 103. The gate electrode material may be a metal-containing material such as TiN, TiO, TaN, TaC, Co, Ru, Al, W, combinations thereof, or multi-layers thereof. After filling the recesses 103 with the gate electrode material, a planarization process, such as CMP, may be performed to remove excess portions of the gate layer stack 120 and excess portions of the gate electrode material, which excess portions are over the top surface of the first ILD 114. The remaining portions of the gate electrode material and the gate layer stack 120 thus form replacement gates of the resulting NSFET device 100. Each gate electrode 122 and the corresponding gate layer stack 120 may be collectively referred to as a gate stack, a replacement gate structure, or a metal gate structure. Each gate stack extends around the respective nanosheets 54.

Note that for simplicity, the various constituent materials of the gate layer stack 120 are not illustrated in FIG. 15A, but shown in FIG. 15B, which is a cross-sectional view of the NSFET device 100 along cross-section F-F of FIG. 15A. In FIG. 15A, the areas 130A and 130B, which correspond to the areas 130A and 130B in FIG. 13, are also illustrated. As illustrated in FIG. 15B, the gate layer stack 120 also completely fills the space between the lowermost nanosheet 54 (e.g., 54A) and the fin 90, and the gate electrode 122 extends around at least portions of the gate layer stack 120. In other words, the gate electrode 122 extends along (and physically contacts) portions of the gate layer stack 120 that are on sidewalls of the nanosheets 54 and on the upper surface of the uppermost nanosheet 54C, but the gate electrode 122 does not extend between the space between two vertically adjacent nanosheets 54 (or between the fin 90 and the lowermost nanosheet 54A).

Additional processing may be performed to finish fabrication of the NSFET device 100, as one of ordinary skill readily appreciates, thus details may not be discussed here. For example, a second ILD may be deposited over the first ILD 114. Gate contacts and source/drain contacts may be formed through the second ILD and/or the first ILD 114 to electrically couple to the gate electrodes 122 and the source/drain regions 112, respectively. In addition, interconnect structures may be formed over the second ILD to electrically connect the underlying electrical components (e.g., transistors) to form functional circuits.

Variations of the disclosed embodiments are possible and are fully intended to be included within the scope of the present disclosure. For example, depending on the type of device (e.g., n-type or p-type device) formed, the second semiconductor material 54 may be removed, and the first semiconductor material 52 may remain to form the nanosheets, which nanosheets function as the channel regions of the NSFET device formed. In embodiments where the first semiconductor material 52 remain to form the nanosheets, inner spacers are formed in recesses in end portions of the second semiconductor material 54 before the second semiconductor material 54 is removed, as one of ordinary skill readily appreciates.

Figure 16:
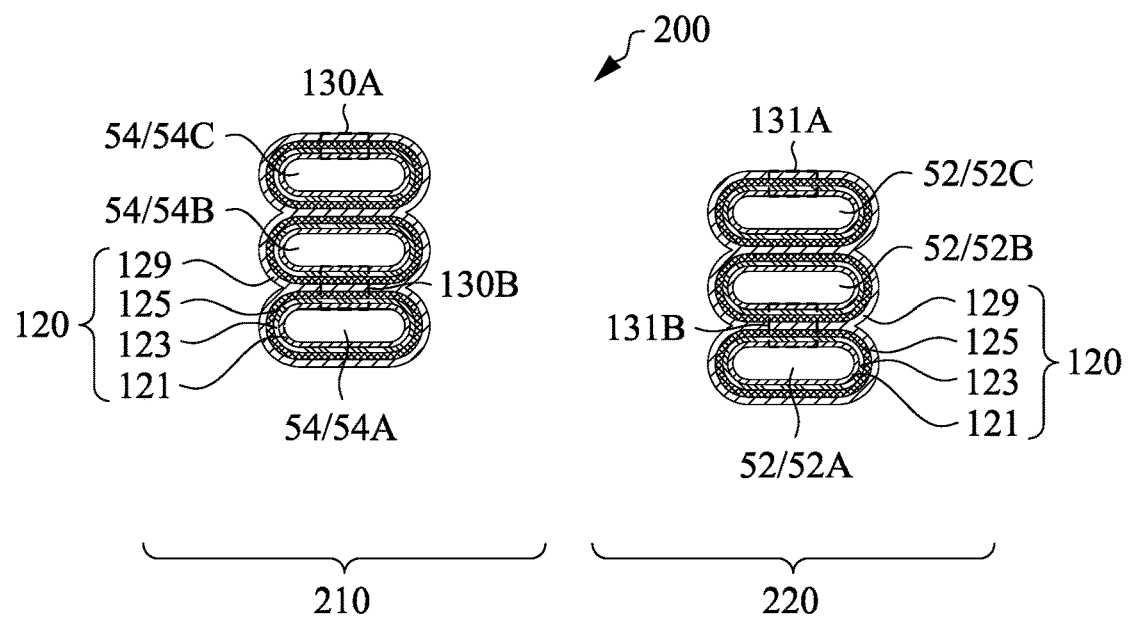
FIGS. 16, 17, 18A, and 18B are cross-sectional views of a nanosheet field-effect transistor device at various stages of manufacturing, in accordance with another embodiment.

FIGS. 16, 17, 18A, and 18B are cross-sectional views of a nanosheet field-effect transistor (NSFET) device 200 at various stages of manufacturing, in accordance with yet another embodiment. Referring to FIG. 16, the NSFET device 200 is similar to the NSFET device 100 in FIG. 13, but the NSFET device 200 has an n-type device region 210 and a p-type device region 220. In the illustrated embodiment, the structure (e.g., nanosheets 54 with gate layer stack 120) in the n-type device region 210 of FIG. 16 is the same as the structure illustrated in FIG. 13, and is formed following the same processing steps illustrated in FIGS. 3A, 3B, 4A, 4B, 5A-5C, 6A-6C, 7A-7C, 8A, 8B, 9A, 9B, 10A, 10B, and 11-13 for forming the structure in FIG. 13. In addition, FIG. 16 further illustrates a structure (nanosheets 52 and gate layer stack 120) formed in the p-type device region 220, which structure is formed in similar processing steps as the structure in the n-type device region 210. For example, since p-type channel region is formed in the p-type device region 220, the second semiconductor material 54 (e.g., Si) is removed to release the first semiconductor material 52 (e.g., SiGe) to form the nanosheets 52. In addition, the inner spacers 55 (see FIG. 18B) are formed between nanosheets 52 in the p-type device region 220. The processing illustrated in FIGS. 6A-6C, 7A-7C, 8A, 8B, 9A, 9B, 10A and 10B can be adapted to form the nanosheets 52, thus details are not discussed. In FIG. 16, the area 131B defines an area between adjacent nanosheets 52, and the area 131A defines an area above an uppermost nanosheet 52 (e.g., 52C).

In an embodiment, to form the NSFET device 200, the processing steps illustrated in FIGS. 2, 3A, 3B, 4A, 4B, and 5A-5C are performed for both the n-type device region 210 and the p-type device region 220. Next, the p-type device region 220 is covered by a first patterned mask layer (e.g., a patterned photoresist) while the processing steps shown in FIGS. 6A-6C, 7A-7C, 8A, 8B, 9A, 9B, 10A and 10B are performed for the n-type device region 210 to form the nanosheets 54. Next, the first patterned mask layer is removed, the n-type device region 210 is covered with a second patterned mask layer, and similar processing steps (e.g., similar to those shown in FIGS. 6A-6C, 7A-7C, 8A, 8B, 9A, 9B, 10A and 10B but adjusted to form nanosheets 52) are performed for the p-type device region 220 to form the nanosheets 52. Next, the second patterned mask layer is removed, and the processing steps illustrated in FIGS. 11-13 are performed for both the n-type device region 210 and the p-type device region 220 to form the structure shown in FIG. 16.

Figure 17:
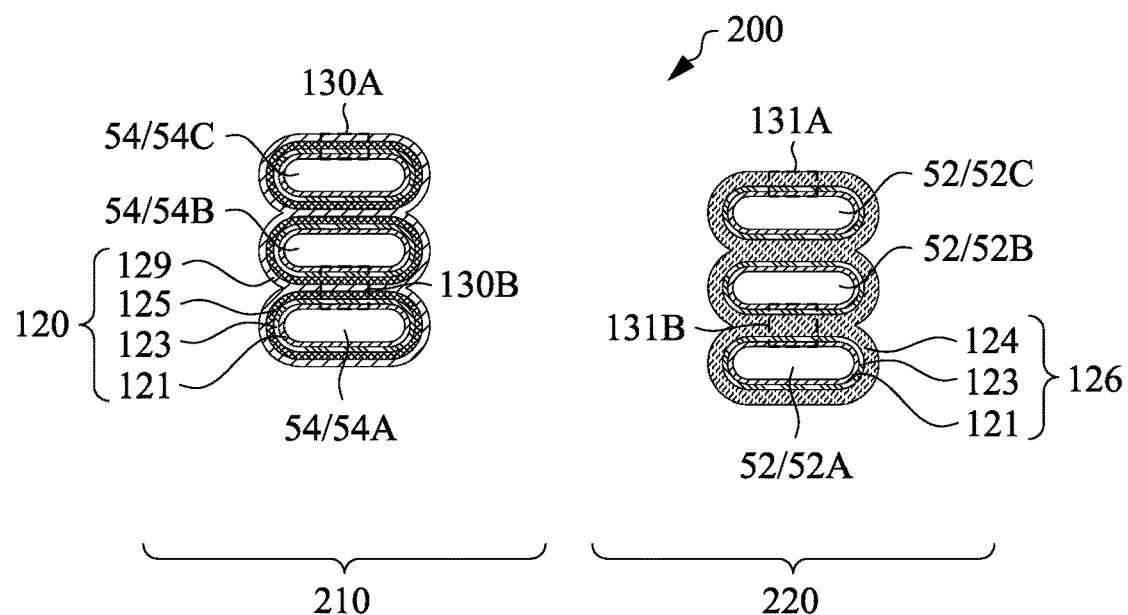

Next, in FIG. 17, a third patterned mask layer is formed to cover the n-type device region 210, and one or more etching processes are performed to remove the liner material 129 and the work function material 125, such that the gate dielectric material 123 around the nanosheets 52 is exposed. Next, a work function material 124, such as a p-type work function material (e.g., TiN), is formed around the nanosheet 52 and around the gate dielectric material 123. After the work function material 124 is formed, the third patterned mask layer is removed. The interfacial dielectric material 121, the gate dielectric material 123, and the work function material 124 form the gate layer stack 126 for the p-type device region 220.

Note that in the example of FIG. 17, the work function material 124 between adjacent nanosheets 52 (in the area 131B) are merged together. Therefore, the thickness of the work function material 124 in the area 131B may be twice or more as the thickness of the work function material 124 in the area 131A. A list of the layers of materials between two adjacent nanosheets 52 (e.g., 52A and 52B) therefore includes: a layer of the interfacial dielectric material 121, a layer of the gate dielectric material 123, a layer of the (merged) work function material 124, a layer of the gate dielectric material 123, and a layer of the interfacial dielectric material 121. In the illustrated embodiment, the work function material 124 (e.g., a p-type work function material such as TiN) does not contain aluminum (which diffuse easily), and therefore, the liner material 129 is not used in the p-type device region 220. The increased space between adjacent nanosheets 52 allows more flexibility in tuning the structure of the work function material 124, such as the number of sublayers in the work function material 124 and the thicknesses of the sublayers. Note that although the work function material 124 (or 125) is illustrated as a single layer in the figures, the work function material 124 (or 125) may have a multi-layer structure with a plurality of sublayers.

Figure 18A:
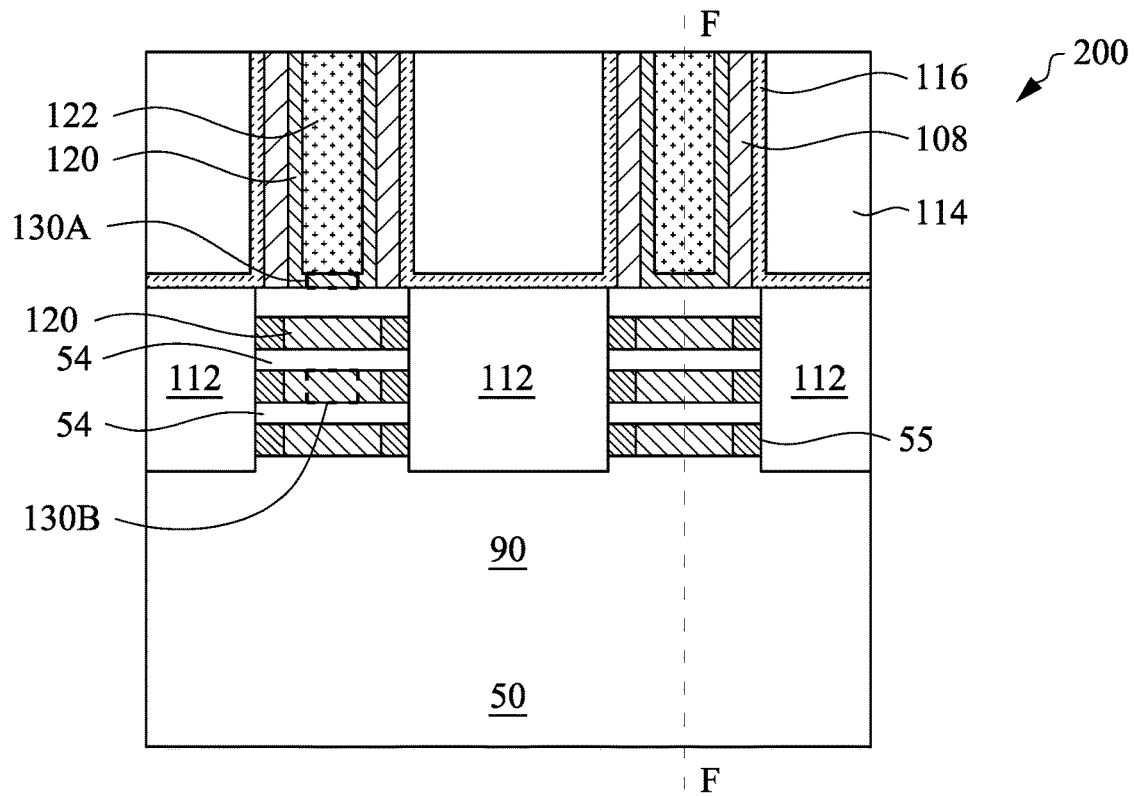
Figure 18B:
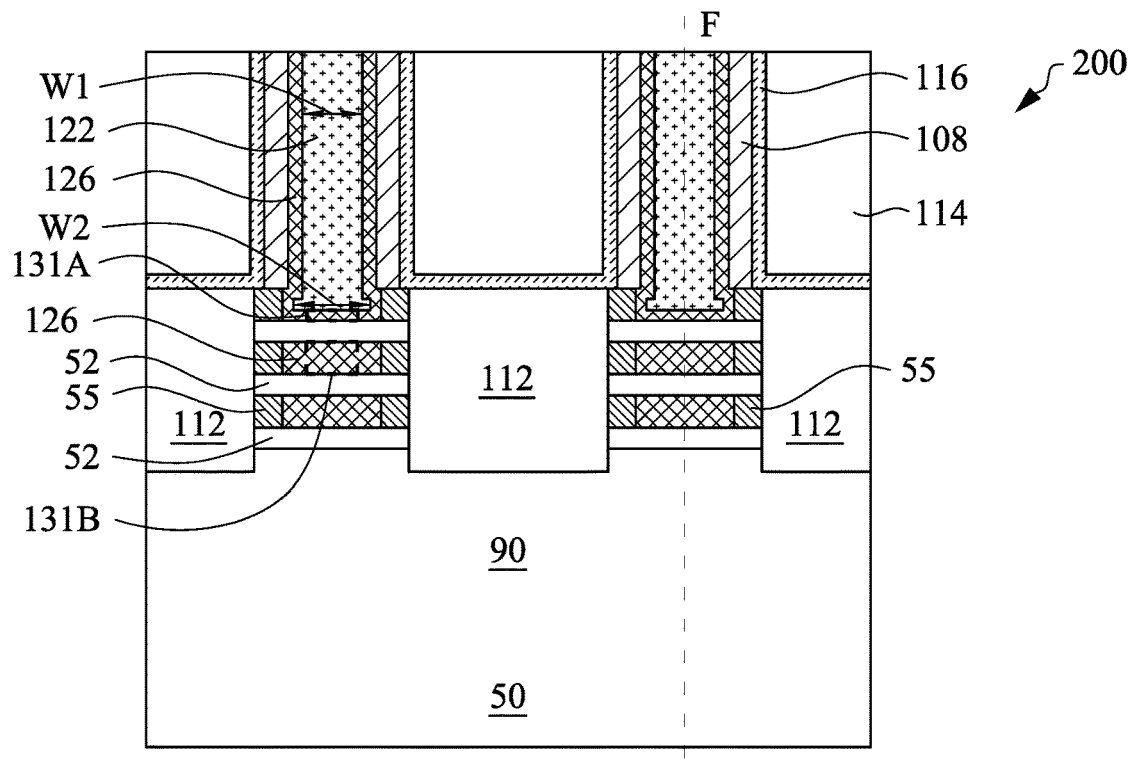

Next, as illustrated in FIGS. 18A and 18B, the gate electrode 122 is formed around the nanosheets 54/52 and around the layer stacks 120/126. FIG. 18A illustrates the cross-sectional view of the NSFET device 200 along a longitudinal direction of a fin in the n-type device region 210, and FIG. 18B illustrates the cross-sectional view of the NSFET device 200 along a longitudinal direction of a fin in the p-type device region 220.

In the illustrated embodiment, the cross-sectional view of FIG. 18A is the same as the cross-sectional view of FIG. 15A, thus details are not repeated. In FIG. 18B, the gate layer stack 126 fills the space between adjacent nanosheets 52 in the p-type device region 220, and therefore, there is no gate electrode 122 between adjacent nanosheets 52 in FIG. 18B. In addition, due to the gate electrode 122 filling the space left by the removal of the topmost layer of the second semiconductor material 54, the gate electrode 122 has a first width W1 measured between gate spacers 108, and has a second width W2 measured between the topmost inner spacers 55, where W2 is larger than W1.

Figure 19:
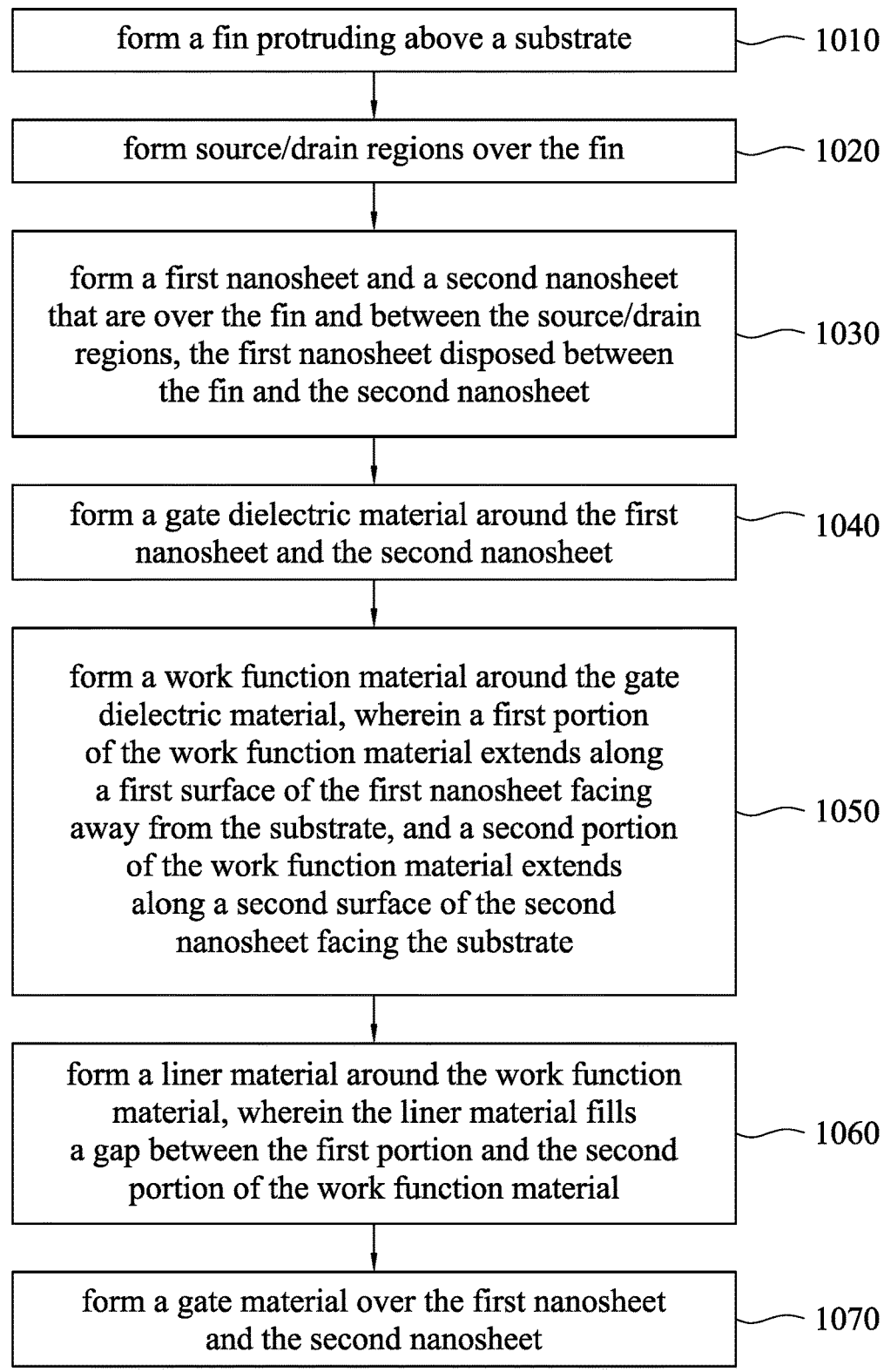
FIG. 19 is a flow chart of a method of forming a semiconductor device, in some embodiments.

FIG. 19 illustrates a flow chart of a method of fabricating a semiconductor device, in accordance with some embodiments. It should be understood that the embodiment method shown in FIG. 19 is merely an example of many possible embodiment methods. One of ordinary skill in the art would recognize many variations, alternatives, and modifications. For example, various steps as illustrated in FIG. 19 may be added, removed, replaced, rearranged, or repeated.

Referring to FIG. 19, at block 1010, a fin is formed protruding above a substrate. At block 1020, source/drain regions are formed over the fin. At block 1030, a first nanosheet and a second nanosheet are formed over the fin and between the source/drain regions, the first nanosheet disposed between the fin and the second nanosheet. At block 1040, a gate dielectric material is formed around the first nanosheet and the second nanosheet. At block 1050, a work function material is formed around the gate dielectric material, wherein a first portion of the work function material extends along a first surface of the first nanosheet facing away from the substrate, and a second portion of the work function material extends along a second surface of the second nanosheet facing the substrate. At block 1060, a liner material is formed around the work function material, wherein the liner material fills a gap between the first portion and the second portion of the work function material. At block 1070, a gate material is formed over the first nanosheet and the second nanosheet.

Embodiments may achieve advantages. By forming the liner material, the disclosed method prevents the work function material around adjacent nanosheet from merging together and forming a thicker work function layer between adjacent nanosheets, thereby avoiding or reducing threshold voltage variation. In addition, the liner material prevents or reduces diffusion of aluminum from the work function layer into other layers of the NSFET device.

In an embodiment, a semiconductor device includes: a fin protruding above a substrate; source/drain regions over the fin; nanosheets between the source/drain regions; and a gate structure over the fin and between the source/drain regions, the gate structure comprising: a gate dielectric material around each of the nanosheets; a work function material around the gate dielectric material; a liner material around the work function material, wherein the liner material has a non-uniform thickness and is thicker at a first location between the nanosheets than at a second location along sidewalls of the nanosheets; and a gate electrode material around at least portions of the liner material. In an embodiment, the work function material is an aluminum-containing material, and the liner material is an oxide. In an embodiment, the work function material is titanium aluminum, and the liner material is aluminum oxide or silicon oxide. In an embodiment, the liner material is silicon. In an embodiment, the work function material is titanium aluminum. In an embodiment, the nanosheets comprise a first nanosheet and a second nanosheet, with the first nanosheet being between the second nanosheet and the substrate, wherein the work function material around the first nanosheet has a first surface facing the second nanosheet, and the work function material around the second nanosheet has a second surface facing the first nanosheet, wherein the liner material fills a space between the first surface and the second surface of the work function material. In an embodiment, the space between the first surface and the second surface of the work function material is free of the gate electrode material. In an embodiment, the semiconductor device further includes an interfacial dielectric material between each of the nanosheets and the gate dielectric material. In an embodiment, the nanosheets include a first nanosheet and a second nanosheet vertically adjacent to the first nanosheet, wherein the interfacial dielectric material, the gate dielectric material, the work function material, and the liner material completely fills a space between the first nanosheet and the second nanosheet. In an embodiment, the interfacial dielectric material, the gate dielectric material, the work function material, and the liner material further completely fills a space between the fin and a lowermost nanosheet of the nanosheets closest to the fin. In an embodiment, the liner material has a first thickness at a first surface of a first nanosheet facing away from the substrate, and has a second thickness at a second surface of the first nanosheet facing the substrate, wherein the first nanosheet is an uppermost nanosheet furthest from the substrate, wherein the second thickness is larger than the first thickness. In an embodiment, the second thickness is about twice the first thickness.

In an embodiment, a semiconductor device includes: a fin protruding above a substrate; a gate structure over the fin; source/drain regions over the fin on opposing sides of the gate structure; and a first channel layer and a second channel layer disposed between the source/drain regions and over the fin, wherein the first channel layer is between the second channel layer and the fin, wherein the gate structure comprises: a gate dielectric material around the first channel layer and around the second channel layer; a work function material around the gate dielectric material; a liner material around the work function material, wherein the liner material has a first thickness over an upper surface of second channel layer distal from the fin, and has a second thickness between the first channel layer and the second channel layer, wherein the first thickness is smaller than the second thickness; and a gate electrode. In an embodiment, the semiconductor device further includes inner spacers between first end portions of the first channel layer and second end portions of the second channel layer, wherein the gate dielectric material, the work function material, and the liner material fill a space between the inner spacers. In an embodiment, the work function material is titanium aluminum, the liner material is aluminum oxide, silicon oxide, or silicon. In an embodiment, the second thickness is about twice the first thickness. In an embodiment, the semiconductor device further includes an interfacial dielectric material between the gate dielectric material and the first channel layer and between the gate dielectric material and the second channel layer, wherein the interfacial dielectric material, the gate dielectric material, the work function material, and the liner material fill a space between the first channel layer and the second channel layer.

In an embodiment, a method of forming a semiconductor device includes: forming a fin protruding above a substrate; forming source/drain regions over the fin; forming a first nanosheet and a second nanosheet that are over the fin and between the source/drain regions, the first nanosheet disposed between the fin and the second nanosheet; forming a gate dielectric material around the first nanosheet and the second nanosheet; forming a work function material around the gate dielectric material, wherein a first portion of the work function material extends along a first surface of the first nanosheet facing away from the substrate, and a second portion of the work function material extends along a second surface of the second nanosheet facing the substrate; forming a liner material around the work function material, wherein the liner material fills a gap between the first portion and the second portion of the work function material; and forming a gate material over the first nanosheet and the second nanosheet. In an embodiment, the gap between the first portion and the second portion of the work function material is free of the gate material. In an embodiment, the liner material is formed of titanium aluminum, and the work function material is formed of aluminum oxide, silicon oxide, or silicon.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a fin protruding above a substrate;
source/drain regions over the fin;
nanosheets between the source/drain regions; and
a gate structure over the fin and between the source/drain regions, the gate structure comprising:
   a gate dielectric material around each of the nanosheets;
   a work function material around the gate dielectric material;
   a liner material around the work function material, wherein the liner material has a non-uniform thickness and is thicker at a first location between the nanosheets than at a second location along sidewalls of the nanosheets; and
   a gate electrode material around at least portions of the liner material.

2. The semiconductor device of claim 1, wherein the work function material is an aluminum-containing material, and the liner material is an oxide.

3. The semiconductor device of claim 2, wherein the work function material is titanium aluminum, and the liner material is aluminum oxide or silicon oxide.

4. The semiconductor device of claim 1, wherein the liner material is silicon.

5. The semiconductor device of claim 4, wherein the work function material is titanium aluminum.

6. The semiconductor device of claim 1, wherein the nanosheets comprise a first nanosheet and a second nanosheet, with the first nanosheet being between the second nanosheet and the substrate, wherein the work function material around the first nanosheet has a first surface facing the second nanosheet, and the work function material around the second nanosheet has a second surface facing the first nanosheet, wherein the liner material fills a space between the first surface and the second surface of the work function material.

7. The semiconductor device of claim 6, wherein the space between the first surface and the second surface of the work function material is free of the gate electrode material.

8. The semiconductor device of claim 1, further comprising an interfacial dielectric material between each of the nanosheets and the gate dielectric material.

9. The semiconductor device of claim 8, wherein the nanosheets include a first nanosheet and a second nanosheet vertically adjacent to the first nanosheet, wherein the interfacial dielectric material, the gate dielectric material, the work function material, and the liner material completely fills a space between the first nanosheet and the second nanosheet.

10. The semiconductor device of claim 9, wherein the interfacial dielectric material, the gate dielectric material, the work function material, and the liner material further completely fills a space between the fin and a lowermost nanosheet of the nanosheets closest to the fin.

11. The semiconductor device of claim 1, wherein the liner material has a first thickness at a first surface of a first nanosheet facing away from the substrate, and has a second thickness at a second surface of the first nanosheet facing the substrate, wherein the first nanosheet is an uppermost nanosheet furthest from the substrate, wherein the second thickness is larger than the first thickness.

12. The semiconductor device of claim 11, wherein the second thickness is about twice the first thickness.

13. A semiconductor device comprising:
a fin protruding above a substrate;
a gate structure over the fin;
source/drain regions over the fin on opposing sides of the gate structure; and
a first channel layer and a second channel layer disposed between the source/drain regions and over the fin, wherein the first channel layer is between the second channel layer and the fin, wherein the gate structure comprises:
   a gate dielectric material wrapping around the first channel layer and the second channel layer;

a work function material wrapping around the gate dielectric material;

a liner material wrapping around the work function material, wherein the work function material wrapping around the first channel layer is disposed between the first channel layer and the liner material wrapping around the first channel layer, wherein the work function material wrapping around the second channel layer is disposed between the second channel layer and the liner material wrapping around the second channel layer, wherein the liner material has a first thickness over an upper surface of the second channel layer distal from the fin, and has a second thickness between the first channel layer and the second channel layer, wherein the first thickness is smaller than the second thickness; and a gate electrode.

14. The semiconductor device of claim 13, further comprising inner spacers between first end portions of the first channel layer and second end portions of the second channel layer, wherein the gate dielectric material, the work function material, and the liner material fill a space between the inner spacers.

15. The semiconductor device of claim 13, wherein the second thickness is about twice the first thickness.

16. The semiconductor device of claim 13, further comprising an interfacial dielectric material between the gate dielectric material and the first channel layer and between the gate dielectric material and the second channel layer, wherein the interfacial dielectric material, the gate dielectric material, the work function material, and the liner material fill a space between the first channel layer and the second channel layer.

17. The semiconductor device of claim 13, wherein the liner material physically contacts the gate electrode.

18. A semiconductor device comprising:
a substrate;
a fin protruding above the substrate;
source/drain regions over the fin;
a first nanosheet and a second nanosheet that are disposed over the fin and between the source/drain regions, wherein the first nanosheet is disposed between the fin and the second nanosheet;
a gate dielectric material around the first nanosheet and the second nanosheet;
a work function material around the gate dielectric material, wherein a first portion of the work function material extends along a first surface of the first nanosheet facing away from the substrate, and a second portion of the work function material extends along a second surface of the second nanosheet facing the substrate;
a liner material around the work function material, wherein the work function material is closer to the first nanosheet and the second nanosheet than the liner material, wherein the liner material fills a gap between the first portion and the second portion of the work function material; and
a gate material over the first nanosheet and the second nanosheet.

19. The semiconductor device of claim 18, wherein the gap between the first portion and the second portion of the work function material is free of the gate material.

20. The semiconductor device of claim 18, wherein the work function material is titanium aluminum, and the liner material is aluminum oxide, silicon oxide, or silicon.

* * * * *